(12) United States Patent
Keen et al.

(10) Patent No.: US 10,616,387 B2
(45) Date of Patent: Apr. 7, 2020

(54) PORTABLE ELECTRONIC DEVICE

(71) Applicant: Apple Inc., Cupertino, CA (US)

(72) Inventors: Bryan D. Keen, San Francisco, CA (US); Sina Bigdeli, Saratoga, CA (US); Sawyer I. Cohen, Menlo Park, CA (US); William A. Counts, Sunnyvale, CA (US); Lucy E. Browning, San Francisco, CA (US); Devon A. Monaco, San Jose, CA (US); Jian Yang, Fremont, CA (US); Eric W. Bates, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/297,389

(22) Filed: Mar. 8, 2019

(65) Prior Publication Data
US 2020/0084310 A1 Mar. 12, 2020

Related U.S. Application Data

(60) Provisional application No. 62/729,943, filed on Sep. 11, 2018.

(51) Int. Cl.
| | |
|---|---|
| *H04M 1/02* | (2006.01) |
| *G06F 1/16* | (2006.01) |
| *H05K 5/03* | (2006.01) |
| *H01M 2/10* | (2006.01) |

(52) U.S. Cl.
CPC ........ *H04M 1/0277* (2013.01); *G06F 1/1635* (2013.01); *H01M 2/1022* (2013.01); *H05K 5/03* (2013.01); *H04M 2001/0204* (2013.01)

(58) Field of Classification Search
CPC .... H04M 1/0249; H04M 1/026; H04M 1/185; H01Q 1/52; H01Q 1/243; H04B 1/3888; A45C 11/00
USPC ......... 455/575.1; 335/219; 174/261; 428/99; 297/452.18
See application file for complete search history.

(56) References Cited

U.S. PATENT DOCUMENTS

| | | | |
|---|---|---|---|
| 2017/0068270 A1* | 3/2017 | Kielland | A45F 5/00 |
| 2017/0331506 A1* | 11/2017 | Landwehr | H04B 1/3888 |
| 2019/0115648 A1* | 4/2019 | Subba | H01Q 1/243 |

\* cited by examiner

*Primary Examiner* — Phuoc H Doan
(74) *Attorney, Agent, or Firm* — Morgan, Lewis & Bockius LLP

(57) ABSTRACT

Electronic devices, such as mobile communication devices, may include several enhancements and modification not found on traditional electronic devices. An electronic device can include a circuit board assembly that includes stacked layers of circuit components that are retained in a stacked configuration and operably connected to each other by retention features such as solder joints. Features can be provided for structural support and thermal mitigation. A battery assembly can accommodate nesting of other components, such as display components, within one or more recesses defined by variable thickness along different regions of the battery assemblies. The battery assembly can further provide a slim profile by including notches to accommodate the increased thickness of a pouch having folded flaps to seal a cell module of the battery assembly.

20 Claims, 17 Drawing Sheets

US 10,616,387 B2

PORTABLE ELECTRONIC DEVICE

CROSS-REFERENCE TO RELATED APPLICATIONS

This application claims the benefit of U.S. Provisional Application No. 62/729,943, entitled "PORTABLE ELECTRONIC DEVICE," filed Sep. 11, 2018, the entirety of which is incorporated herein by reference.

TECHNICAL FIELD

The present description relates generally to an electronic device, and, more particularly, to portable electronic device (e.g., smartphone) having various features and enhancements.

BACKGROUND

Portable electronic devices are known to include a housing and a cover glass that combines with the housing to enclose components such as a circuit board, a display, and a battery. Also, portable electronic devices are known to communicate over a network server to send and receive information, as well as communicate with a network carrier to send and receive voice communication.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

The following disclosure relates to an electronic device, such as a mobile communication device that takes the form of a smart phone or a tablet computer device. The electronic device may include several enhancements and modification not found on traditional electronic devices.

The electronic device can include a circuit board assembly that includes stacked layers of circuit components that are retained in a stacked configuration and operably connected to each other by retention features such as solder joints. The circuit board assembly can further include one or more stiffeners that provide structural rigidity and thermal mitigation across the assembly. The circuit board assembly can further include different arrangements for conductive pathways that facilitate targeted dissipation of heat across the assembly.

The electronic device may include a battery assembly that includes multiple battery components. For example, the battery assembly may include a first battery component coupled to the second battery component, with each of the first battery component and the second battery component designed to supply energy for operation components (such as integrated circuits carried by the circuit assembly, the vision system, and/or the dual camera assembly). The electronic device may include a battery assembly that has two battery portions arranged in an L-shape.

The battery assemblies of the electronic device can accommodate nesting of other components, such as display components, within one or more recesses defined by variable thickness along different regions of the battery assemblies. The battery assemblies can further provide a slim profile by including notches to accommodate the increased thickness of a pouch having folded tabs to seal a cell module of the battery assembly.

These and other embodiments are discussed below with reference to FIGS. 1-33. However, those skilled in the art will readily appreciate that the detailed description given herein with respect to these Figures is for explanatory purposes only and should not be construed as limiting.

Figure 1:
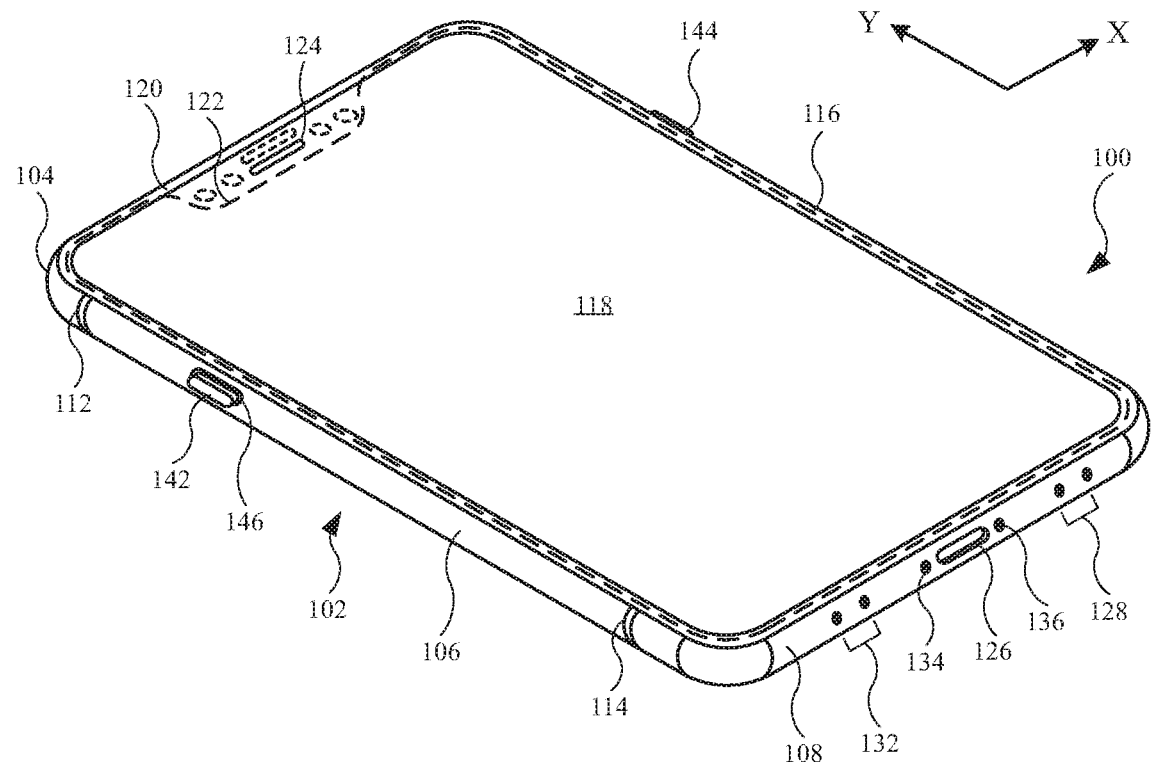
FIG. 1 illustrates a front isometric view of an embodiment of an electronic device, in accordance with some described embodiments.

FIG. 1 illustrates a front isometric view of an embodiment of an electronic device 100, in accordance with some described embodiments. In some embodiments, the electronic device 100 is a tablet computer device. In the embodiment shown in FIG. 1, the electronic device 100 is a mobile wireless communication device (a smartphone, for example). The electronic device 100 may include a band 102 that defines an outer perimeter of the electronic device 100. The band 102 may include a metal, such as aluminum, stainless steel, or an alloy that includes at least one of aluminum or stainless steel. The band 102 may be composed of several sidewall components, such as a first sidewall component 104, a second sidewall component 106, a third sidewall component 108 (opposite the first sidewall component 104), and a fourth sidewall component (not shown in FIG. 1). The aforementioned sidewall components may include any material(s) previously described for the band 102.

In some instances, some of the sidewall components form part of an antenna assembly (not shown in FIG. 1). As a result, a non-metal material, or materials, may separate the sidewall components of the band 102 from each other in order to electrically isolate the sidewall components. For example, a first composite material 112 separates the first sidewall component 104 from the second sidewall component 106, and a second composite material 114 separates the second sidewall component 106 from the third sidewall component 108. The aforementioned composite may include an electrically inert, or insulating, material(s), such as plastics and/or resin, as non-limiting examples.

The electronic device 100 may further include a display assembly 116 (shown as a dotted line) that is covered by a protective cover 118. The display assembly 116 may include multiple layers (discussed below), with each layer providing a unique function. The display assembly 116 may be partially covered by a border 120, or frame, that extends along an outer edge of the protective cover 118 and partially covers an outer edge of the display assembly 116. The border 120 can be positioned to hide or obscure any electrical and mechanical connections between the layers of the display assembly 116 and flexible circuit connectors. This will be shown below. Also, the border 120 may include uniform thickness. For example, the border 120 may include a thickness that generally does not change in the X- and Y-dimensions.

Also, as shown in FIG. 1, the display assembly 116 may include a notch 122, representing an absence of the display assembly 116. The notch 122 may allow for a vision system (discussed below) that provides the electronic device 100 with information for object recognition, such as facial recognition. In this regard, the electronic device 100 may include a masking layer with openings (shown as dotted lines) designed to hide or obscure the vision system, while the openings allow the vision system provide the object recognition information. This will be further discussed below. Also, the protective cover 118 may be formed from a transparent material, such as glass, plastic, sapphire, or the like. In this regard, the protective cover 118 may be referred to as a transparent cover, a transparent protective cover, or a cover glass (when the protective cover 118 includes glass). As shown in FIG. 1, the protective cover 118 includes an opening 124, which may represent a single opening of the protective cover 118. The opening 124 may allow for transmission of acoustical energy (in the form of audible sound) into the electronic device 100, which may be received by a microphone (not shown in FIG. 1) of the electronic device 100. Further, the opening 124 may allow for transmission of acoustical energy (in the form of audible sound) out the electronic device 100, which may be generated by an audio module (not shown in FIG. 1) of the electronic device 100. Also, the electronic device 100 may not include a button, such as "home button," commonly found in electronic devices, as the protective cover 118 does not include additional openings.

The electronic device 100 may further include a port 126 designed to receive a connector of a cable assembly. The port 126 allows the electronic device 100 to communication data information (send and receive), and also allows the electronic device 100 to receive electrical energy to charge a battery assembly (not shown in FIG. 1). Accordingly, the port 126 may include terminals (not shown in FIG. 1) that electrically couple to the connector.

Also, the electronic device 100 may include several openings. For example, the electronic device 100 may include openings 128 that allow an additional audio module (not shown in FIG. 1) of the electronic device to emit acoustical energy out of the electronic device 100. The electronic device 100 may further include openings 132 that allow an additional microphone (not shown in FIG. 1) of the electronic device to receive acoustical energy. Also, the electronic device 100 may include a first fastener 134 and a second fastener 136 designed to secure with a rail (not shown in FIG. 1) that is coupled to the protective cover 118. In this regard, the first fastener 134 and the second fastener 136 are designed to couple the protective cover 118 with the band 102.

The electronic device 100 may include several control inputs designed to provide a command to the electronic device 100. For example, the electronic device 100 may include a first control input 142 and a second control input 144. The aforementioned control inputs may be used to adjust the visual information presented on the display assembly 116 or the volume of acoustical energy output by an audio module, as non-limiting examples. The controls may include one of a switch or a button designed to generate a command to a processor circuit (not shown in FIG. 1). The control inputs may at least partially extend through openings in the sidewall components. For example, the second sidewall component 106 may include an opening 146 that receives the first control input 142.

Figure 2:
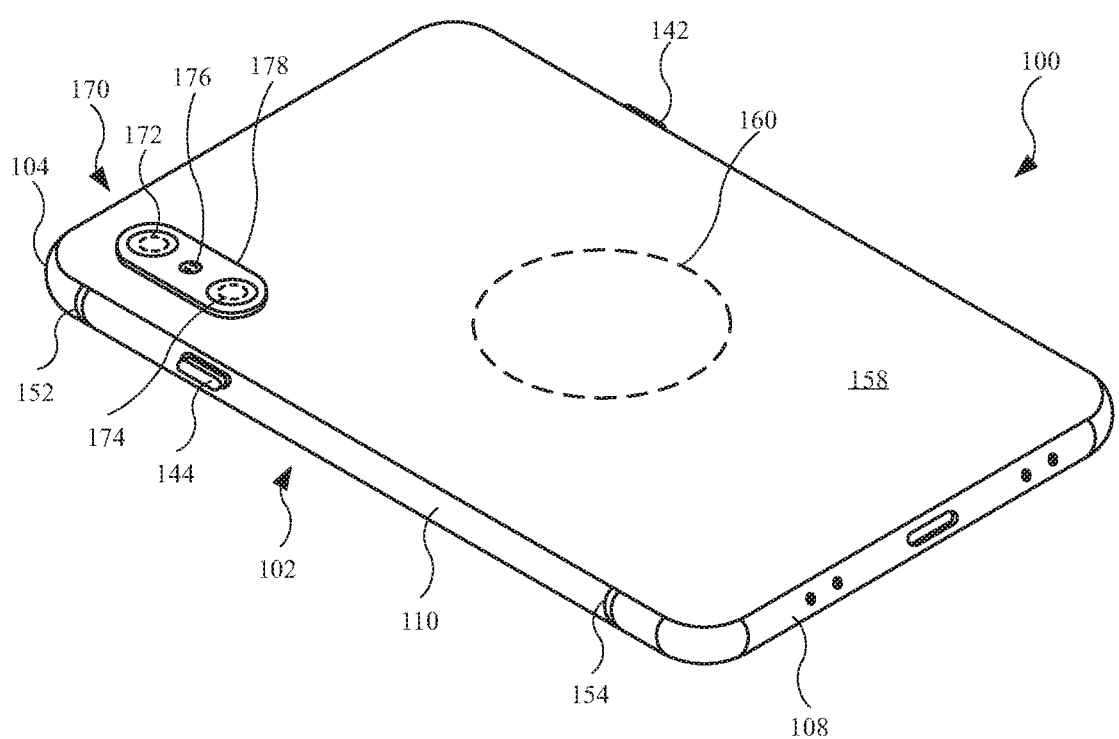
FIG. 2 illustrates a rear isometric view of the electronic device shown in FIG. 1.

FIG. 2 illustrates a rear isometric view of the electronic device 100 shown in FIG. 1. In addition to the aforementioned sidewall components, the band 102 may further include a fourth sidewall component 110. As shown, a third composite material 152 separates the first sidewall component 104 from the fourth sidewall component 110, and a fourth composite material 154 separates the fourth sidewall component 110 from the third sidewall component 108.

The electronic device 100 may further include a protective cover 158 that couples with the band 102. In this regard, the protective cover 158 may combine with the band 102 to form an enclosure of the electronic device 100, with the enclosure (band 102 and protective cover 158) defining an internal volume that carries several internal components, such as a battery assembly, circuit board assembly, vision system, as non-limiting examples. The protective cover 158 may include any material(s) previously described for the protective cover 158 (shown in FIG. 1). When the protective cover 158 include a non-metal material, the electronic device 100 may provide hardware (and software) to support wireless charging. For example, the electronic device 100 may include a wireless power receiving module 160 (represented by a dotted line) covered by the protective cover 158. The wireless power receiving module 160 is designed to receive an induced current when exposed to an alternating electromagnetic field. This will be further discussed below. Also, the protective cover 118 (shown in FIG. 1) may be referred to as a "front protective cover" and the protective cover 158 may be referred to as a "rear protective cover," as the front of the electronic device 100 is generally associated with the display assembly 116 (which is covered by the protective cover 118), and the back of the electronic device 100 is generally associated with a rear wall, such as the protective cover 158.

The electronic device 100 may further include a camera assembly 170, which may include a dual camera assembly. As shown, the camera assembly 170 may include a first camera module 172, a second camera module 174, and a light emitter 176 positioned between the first camera module 172 and the second camera module 174. The light emitter 176 is designed to provide additional lighting during an image capture event by the first camera module 172 and/or the second camera module 174. However, it is desired to isolate some of the light "leakage" from the light emitter into the first camera module 172 and the second camera module 174. In this regard, the camera assembly 170 may further include a trim element (not shown in FIG. 1) designed to optically isolate the light emitter 176 from the first camera module 172 and the second camera module 174. In this manner, the first camera module 172 and the second camera module 174 may only receive desired light from the light emitter 176, such as light reflected from an object, the image of which is the first camera module 172 and/or the second camera module 174). The trim element will be further shown and described below. Also, the camera assembly 170 may further include a protective cover 178 formed from a transparent material that covers the first camera module 172, the second camera module 174, and the light emitter 176. However, the protective cover 178 may include a masking layer (not shown in FIG. 2) designed to at least partially obscure part of the first camera module 172, the second camera module 174, and the light emitter 176. It should be noted, however, that the masking layer includes openings that allow the first camera module 172 and the second camera module 174 to capture images, and that allow the light emitter 176 to emit light that exits the electronic device 100. Also, as shown in FIG. 2, the first camera module 172 and the second camera module 174 are aligned (collectively) in a manner that is parallel with respect to the second sidewall component 106 (shown in FIG. 1) and the fourth sidewall component 110. In other words, an imaginary line can be drawn through the first camera module 172 and the second camera module 174 that is parallel with respect to the second sidewall component 106 (shown in FIG. 1) and the fourth sidewall component 110.

Figure 3:
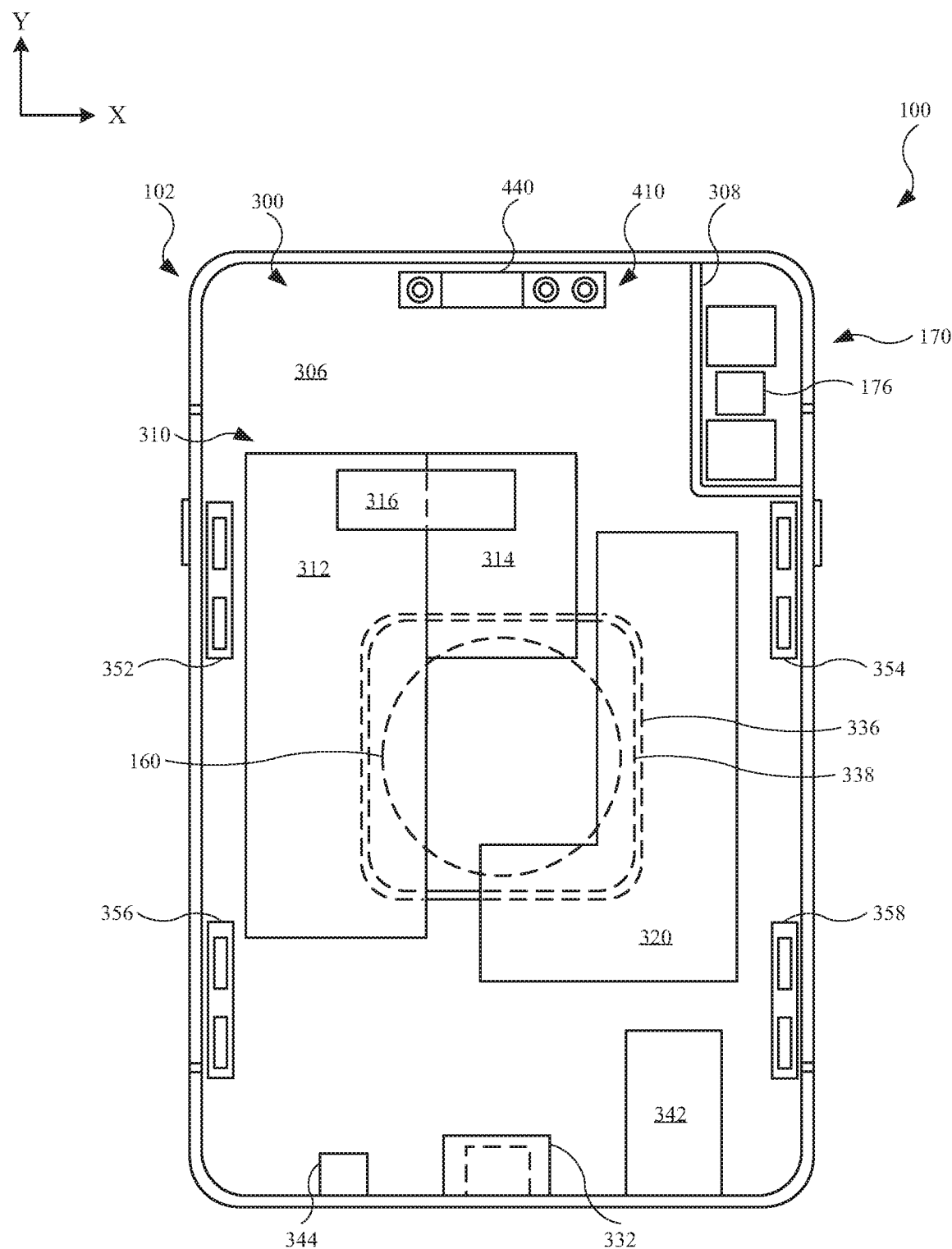
FIG. 3 illustrates a plan view of the electronic device shown in FIG. 1, with the display assembly and the protective cover removed.

FIG. 3 illustrates a plan view of the electronic device 100 shown in FIG. 1, with the display assembly and the protective cover removed. The layout of several components in the internal volume. For purposes of simplicity and illustration, electrical connections, such as flexible circuit, wires, cables, etc., between internal components are removed. As shown, the electronic device 100 may include a vision system 410 and a bracket assembly 440 used to carry the vision system 410. The vision system 410 may provide with the electronic device 100 with information related to object recognition, including facial recognition. The bracket assembly 440 is designed to maintain a fixed distance between the optical components of the vision system 410. The features of the vision system 410 and the bracket assembly 440 will be further discussed below.

The electronic device 100 may further include a chassis 306 that provides structural support. The chassis 306 may include a rigid material, such as a metal. Also, the chassis 306 may be coupled to the band 102. In this manner, the chassis 306 may also provide an electrical grounding path for components electrically coupled to the chassis. Also, the chassis 306 may include a wall 308. The wall 308 may combine with the band 102 to surround the camera assembly 170. The wall 308 may also limit or prevent light generated from the light emitter 176 from further entering the internal volume 300.

The electronic device 100 may further include a battery assembly 310 that includes a first battery component 312 coupled with a second battery component 314 by coupling member 316. The coupling member 316 may include an adhesive material. Both the first battery component 312 and the second battery component 314 are designed to generate electrical energy that can be used by several aforementioned components in the internal volume 300. Also, as shown in FIG. 3, the battery assembly 310 resembles an L-shape, based upon the combined shape of the first battery component 312 and the second battery component 314.

The shape of the battery assembly 310 may accommodate other components. For example, the electronic device 100 may further include a circuit board assembly 320. The circuit board assembly 320 may include at least two circuit boards in a stacked configuration. The stacked configuration may conserve space in the internal volume 300, particularly in least one of the X- and Y-dimensions, X- and Y-dimensions (as well as a Z-dimension, discussed later) referring to Cartesian coordinates. The circuit board assembly 320 may include several active components (such as integrated circuits) that provide the primary processing for the electronic device 100. Also, similar to the battery assembly 310, the circuit board assembly 320 may resemble an L-shape. In this manner, both the battery assembly 310 and the circuit board assembly 320 can be shaped to conserve space in the internal volume 300.

The electronic device 100 may further include a dock 332 in a location corresponding to the port 126 (shown in FIG. 1). The dock 332 may include terminals and other electrical connection points (not shown). The dock 332, in conjunction with the port 126, can receive a connector (used with a cable assembly), thereby allowing the electronic device to send and receive data transmission. Also, the dock 332 can receive electrical energy used to recharge the battery assembly 310.

Moreover, the electronic device 100 may further include a wireless power receiving module 160 designed to provide electrical energy to the battery assembly 310. The wireless power receiving module 160 may include a receiver coil (not shown in FIG. 3) designed to receive an induced current by an alternating electromagnetic field generated by a transmitter coil (not shown) that is external with respect to the electronic device 100. Also, the chassis 306 may include an opening 336 (defined by a void in the chassis 306) such that the chassis 306 does not impede the alternating electromagnetic field. Also, the wireless power receiving module 160 may include a shielding element 338 designed to shield at least some components in the internal volume 300 from the alternating electromagnetic field.

The electronic device 100 may further include an audio module 342 designed to generate acoustical energy in the form of audible sound. The electronic device 100 may further include a microphone 344 designed to receive acoustical energy. Also, the electronic device may further include several rail clips designed to receive rails secured to the protective cover 118 (shown in FIG. 1). For example, the electronic device 100 may include a first rail clip 352, a second rail clip 354, a third rail clip 356, and a fourth rail clip 358. The rails designed to couple with the aforementioned rail clips will be shown below.

As discussed above, the circuit board assembly 320 may include at least two circuit boards in a stacked configuration. The separate circuit board layers can be structurally and functionally connected to each other during assembly and for operation within the electronic device 100. For example, an interposer 730 can be provided with an engagement feature for coupling the circuit board layers to each other. The interposer 730 can be integrally connected to either one of the circuit board layers. The separate circuit board layers can also be disconnected from each other by applying forces to separate them. These forces can cause high stress concentrations to occur at or near the interposer 730 during separation and/or manipulation of the two separate circuit board layers. In particular, stress concentrations can be high at a juncture between the interposer 730 of one layer and a portion of another layer. Additional circuit retention features can be provided at this juncture to improve retention of the layers to each other.

Figure 4:
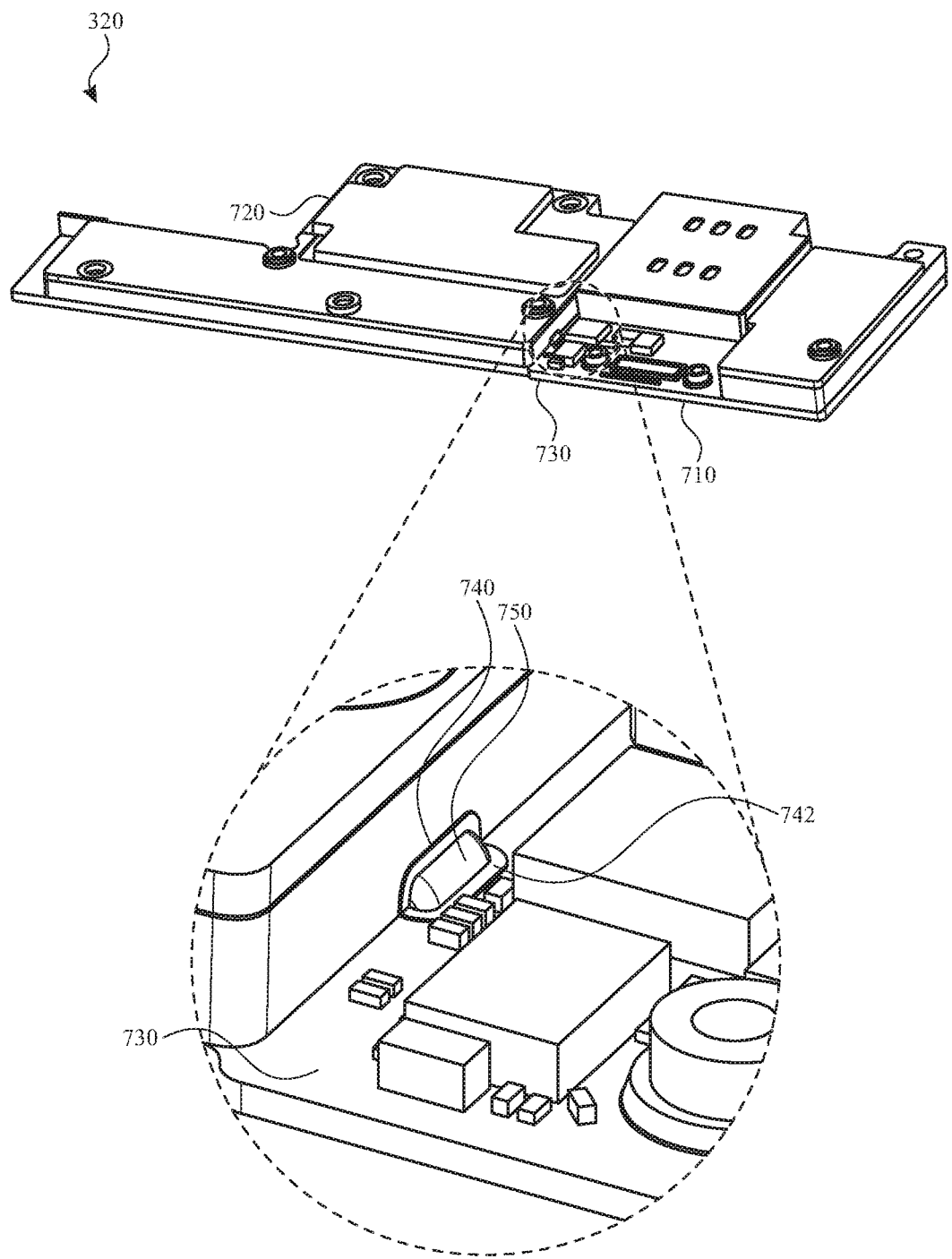
FIG. 4 illustrates a perspective view of a circuit board assembly, with an enlarged view of a solder fillet.

As shown in FIG. 4, separate circuit layers can be joined together, with the interposer 730 of a first circuit layer 710 intersecting a side of a second circuit layer 720. A solder joint and/or plating can be included to provide electrical (e.g., functional and/or operational) connectivity and mechanical (e.g., structural) support. A solder joint 750 can be provided across surfaces of both the first circuit layer 710 and the second circuit layer 720. Either or both of the first circuit layer 710 and the second circuit layer 720 can provide plating 740, 742 on surfaces that face each other or intersect each other. Etching, texturing, and/or other priming can also be provided on surfaces to increase bond strength of solder joints 750. The plating 740, 742 can be of a conductive metal, such as copper.

Figure 5:
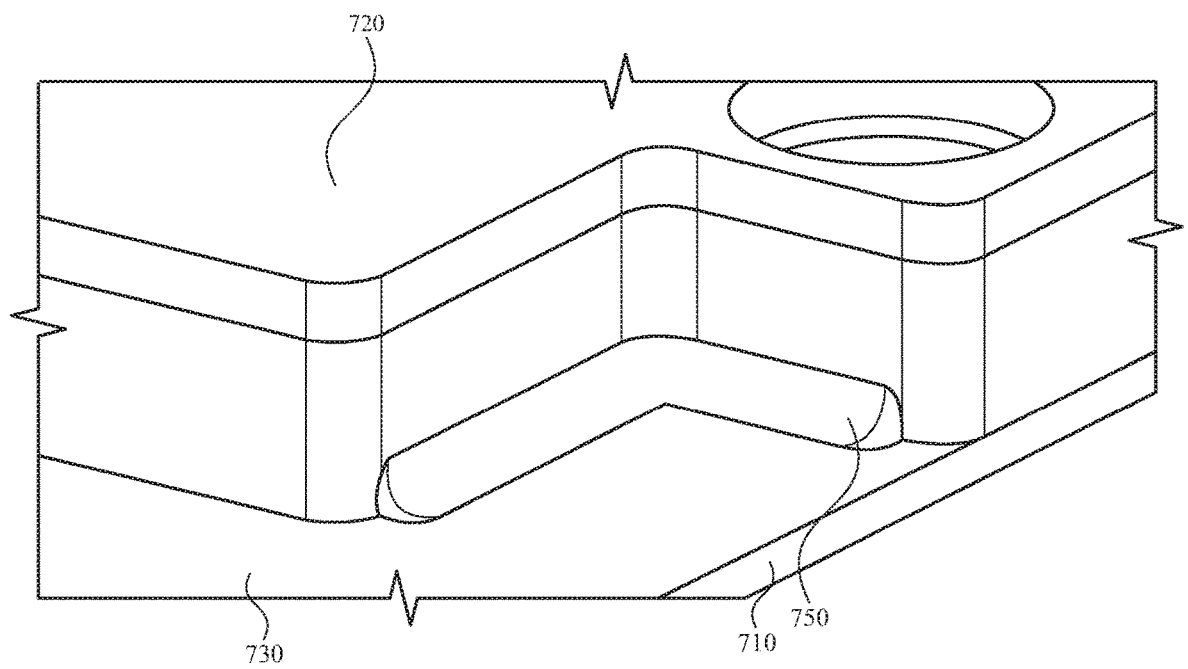
FIG. 5 illustrates a perspective view of a circuit board assembly with a solder fillet.

As shown in FIG. 5, another example of a solder joint is illustrated. The solder joint can form a fillet or other shape along one or more surfaces spanning portions of both the first circuit layer 710 and the second circuit layer 720.

Figure 6:
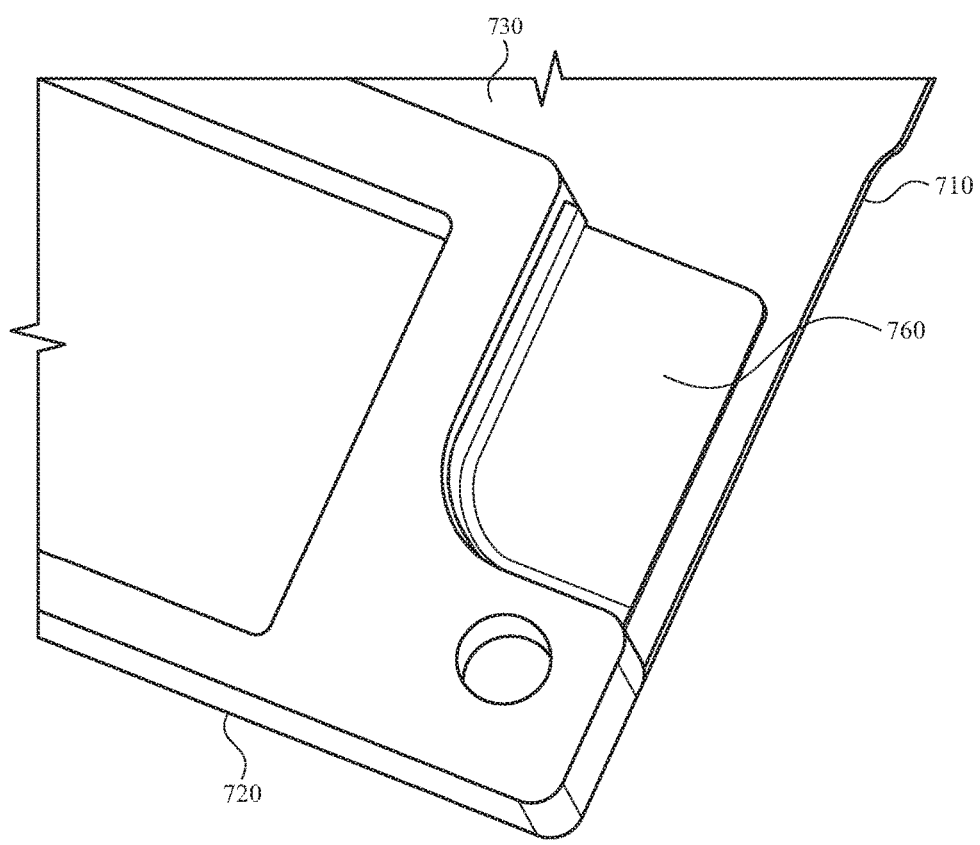
FIG. 6 illustrates a perspective view of a circuit board assembly with a corner bracket.

As shown in FIG. 6, a corner bracket can be provided along one or more surfaces spanning portions of both the first circuit layer 710 and the second circuit layer 720. The corner bracket 760 can include a portion that extends along the first circuit layer 710 and a portion that extends along the second circuit layer 720. The corner bracket 760 can be soldered to one or both of the first circuit layer 710 and the second circuit layer 720. The corner bracket 760 can be of a material, such as metal, that facilitates bonding with solder and provides structural stiffness. The corner bracket 760 can be applied in locations where edge plating cannot be applied, for example due to space and access limitations.

Figure 7:
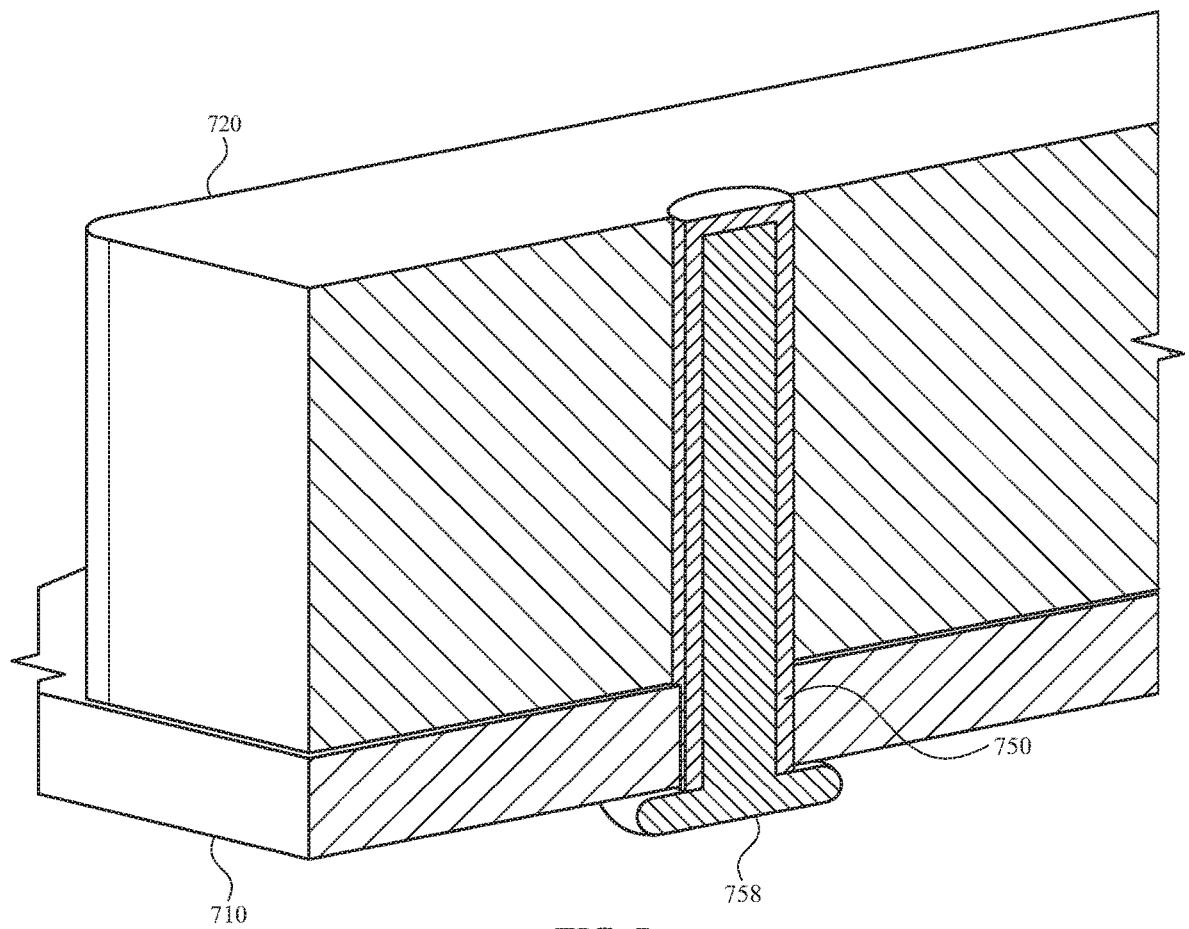
FIG. 7 illustrates a perspective sectional view of a circuit board assembly with a solder pin.

As shown in FIG. 7, a soldered pin can be provided to secure the first circuit layer 710 and the second circuit layer 720 together. The pin 758 can extend through at least a portion of the first circuit layer 710 and at least a portion of the second circuit layer 720. The pin 758 can include a head that protrudes from a surface of one of the layers. At an outer surface of the pin 758, solder material can be provided. The solder-coated pin 758 can be inserted into a hole or holes of the layers, and the solder joint 750 can be heated to bond to surfaces of the first and second layers, as well as a core of the pin 758. The length of the solder joint 750 can provide significant bonding that can be maintained against shear forces applied to the pin 758. The core of the pin 758 can be of a material that is different from the solder material.

Figure 8:
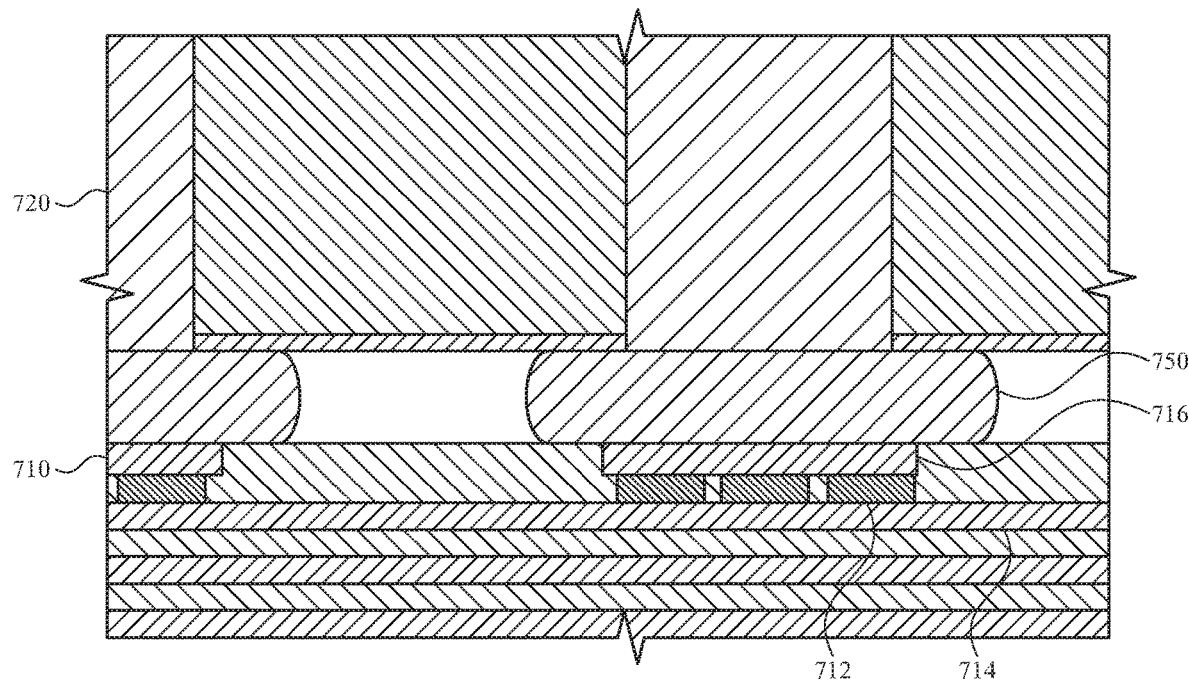
FIG. 8 illustrates a sectional view of a circuit board assembly with a via arrangement.
Figure 9:
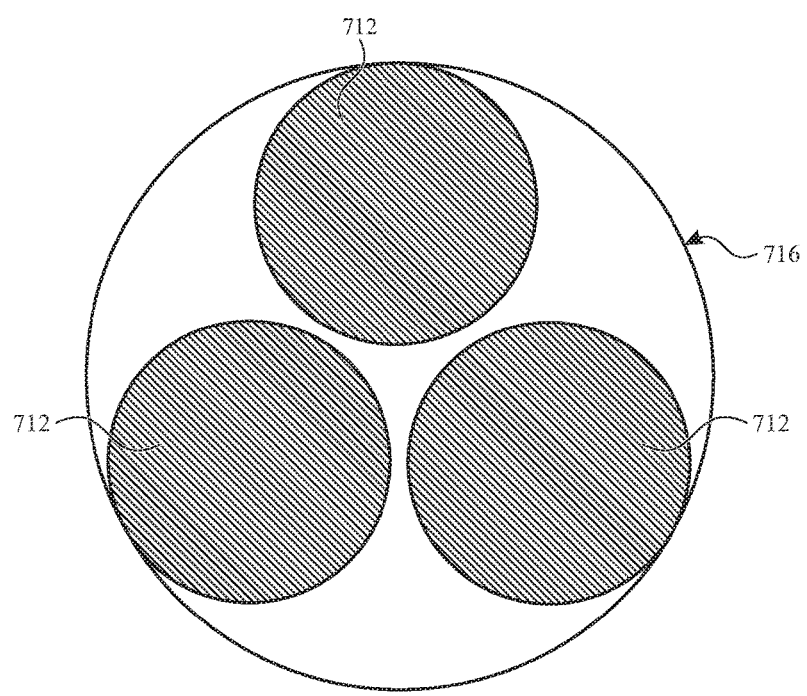
FIG. 9 illustrates another sectional view of the circuit board assembly of FIG. 9.

As shown in FIG. 8, the layers of the circuit board can be joined together by solder joints between opposing surfaces of the circuit layers. The solder joints can provide structural retention and electrical conductivity between the circuit layers. At a surface of one or both of the circuit layers, a conductive pad 716 can be provided for bonding with the solder joint. The conductive pad 716 can be susceptible to separation from the rest of its corresponding layer once bonded to the solder joint. To enhance the retention of the conductive pad 716, multiple vias 712 can be provided between the conductive pad 716 and conductive layers 714 within the corresponding circuit layer. As shown in FIG. 9, multiple vias 712 can be provided along a surface of the conductive pad 716. The vias 712 can be 2, 3, 4, 5, 6, 7, 8, 9, or more than 9 vias 712 for a corresponding conductive pad 716. The number of vias 712 can be selected to achieve both adequate bonding strength and maintaining the integrity of the conductive pad 716. The multiple vias 712 anchor the conductive pad 716 to the underlying conductive layers 714. The vias 712 can be symmetrically distributed along the surface of the conductive pad 716. The vias 712, the conductive pad 716, and/or the conductive layers 714 can be of a conductive metal, such as copper.

Figure 10:
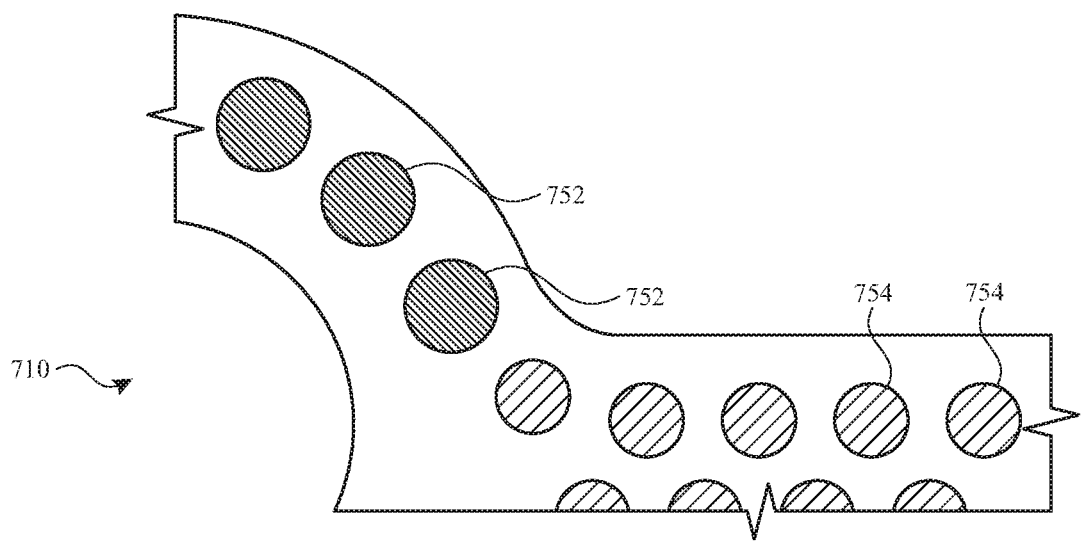
FIG. 10 illustrates a top view of a circuit board assembly with solder portions.
Figure 11:
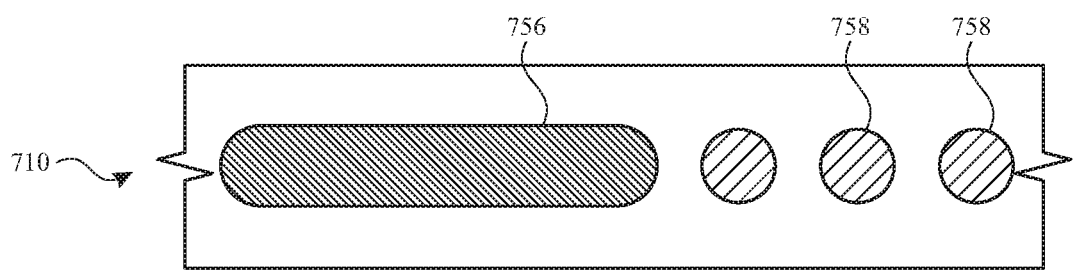
FIG. 11 illustrates a top view of a circuit board assembly with merged solder portions.

As shown in FIG. 10, solder joints can be printed along a surface of a circuit layer. It can be desirable to have a consistent height across separate solder joints. Some solder joints are larger in size (e.g., diameter) that other to achieve adequate bonding at different location. For example, first solder joints 752 may be larger at locations of mechanical stress, such as at the location of mechanical fasteners. At other regions, the second solder joints 754 may be smaller in at least one dimension (e.g., width, thickness), other than height, across the surface of a substrate. To provide consistent height across different solder joints 750, certain solder joints can be merged together by printing a long solder joint 756 that extends across a distance that would span multiple individual solder joints. By providing a longer solder joint (e.g., longer in one dimension), the resulting height can be made to be similar to other solder joints that are larger in another dimension. As a result, the height is consistent according to a desired coupling separation between the circuit layers.

Figure 12:
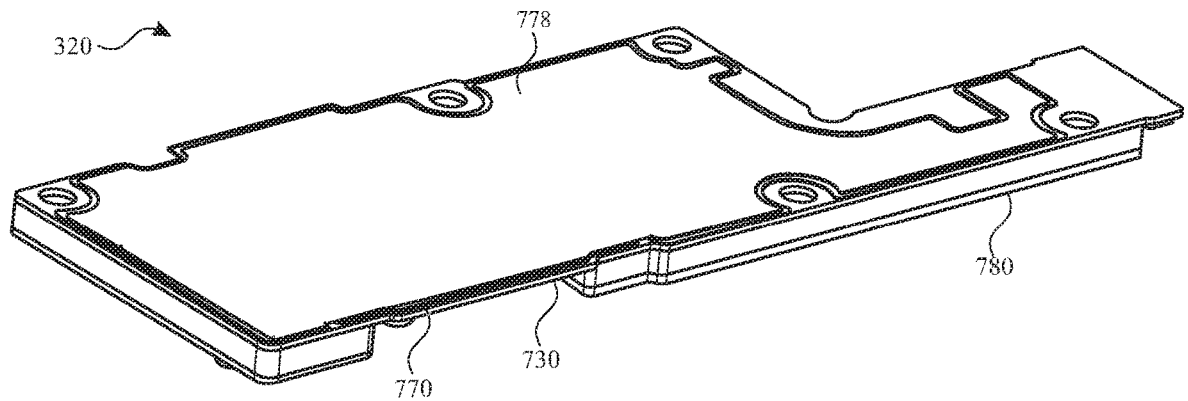
FIG. 12 illustrates a perspective view of a circuit board assembly with a cover layer.

It can be desirable to provide structural support along a surface of a circuit assembly and to provide thermal mitigation for controlled heat distribution away from the circuit assembly. As shown in FIG. 12, some circuit assemblies include a stiffener 770 and a cover 778 that extend across multiple layers of the circuit board assembly 320, including an interposer 730 of one of the layers. As discussed above, the interposer 703 can be included to provide structural support to one or more layers that are connected to each other in the vicinity of the interposer 730. The stiffener 770 can provide strength with a rigid material, such as stainless steel. The cover 778 can provide thermal distribution with a thermally conductive material, such as graphite. The heat can be dissipated away from circuit components 780 of the circuit board assembly 320 and to other portions of the electronic device, such as the band at the outer periphery of the electronic device. However, it can be desirable to provide increased stiffness at selection locations, such as at and near the interposer 730. It can also be desirable to control thermal distribution to adequately move heat away from the circuit board assembly 320 without directing excessive heat to the exterior of the device and to the user holding the device.

Figure 13:
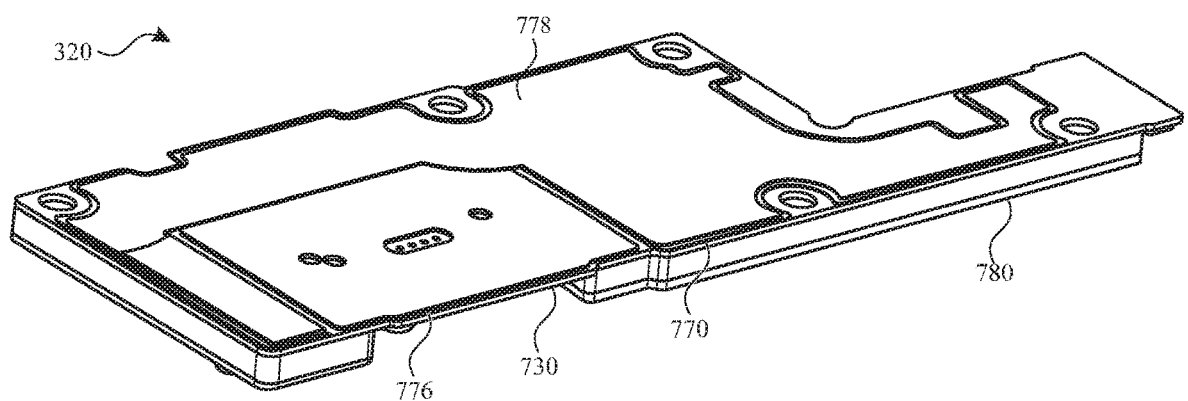
FIG. 13 illustrates a perspective view of a circuit board assembly with a clad stiffener.

As shown in FIG. 13, the first stiffener and the cover layer can be interrupted along a region of the circuit layers. For example, a clad stiffener 776 can be provided across a region that includes the interposer 730 as well as other portions of the circuit layers that are adjacent to and/or intersecting with the interposer 730. In this region, the first stiffener 770 and the cover 778 can be absent, leaving a space that can be filled with the clad stiffener 776, which can have a thickness that is substantially equal to the thickness of the adjacent first stiffener 770 and cover 778.

Figure 14:
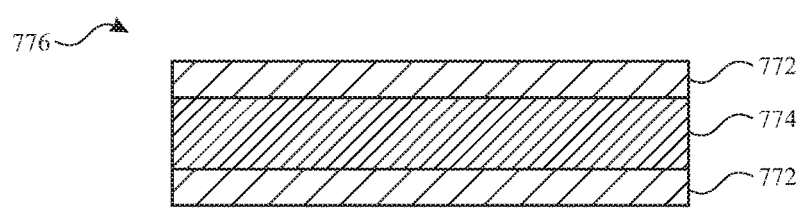
FIG. 14 illustrates a sectional view of the clad stiffener of FIG. 13.

As shown in FIG. 14, the clad stiffener 776 can include outer layers and an inner layer that provide both rigidity and thermal conductivity. For example, the outer layers can include a metal, such as stainless steel, or another material (e.g., metal) that provides higher rigidity than the rigidity of the inner layer. The inner layer can include a metal, such as aluminum or copper, another material (e.g., metal) that has higher thermal conductivity than a material of the outer layer.

By omitting a portion of the cover 778 (e.g., of graphite), thermal conductivity can be reduced in the region of the clad stiffener 776. However, a desired amount of thermal conductivity can be maintained based on the relative amount and type of material provided in the inner layer. Accordingly, the thermal distribution can be controlled so that the thermal pathways more efficiently distribute heat across the entire circuit board assembly 320 before the heat emanates to the outer periphery of the device. The clad stiffener 776 can also have lower mass than would the amount of first stiffener 770 and cover 778 that is omitted from the region of the clad stiffener 776.

The clad stiffener 776, the first stiffener 770, and/or the cover 778 can be used as a conductive layer, for example to connect portions of the circuit board assembly 320 to ground. The clad stiffener 776 can include nickel plating to facilitate soldering. Holes can be provided through the clad stiffener 776 to allow the escape of gas created during soldering, thereby reducing or eliminating bubbling at the solder joints.

Figure 15:
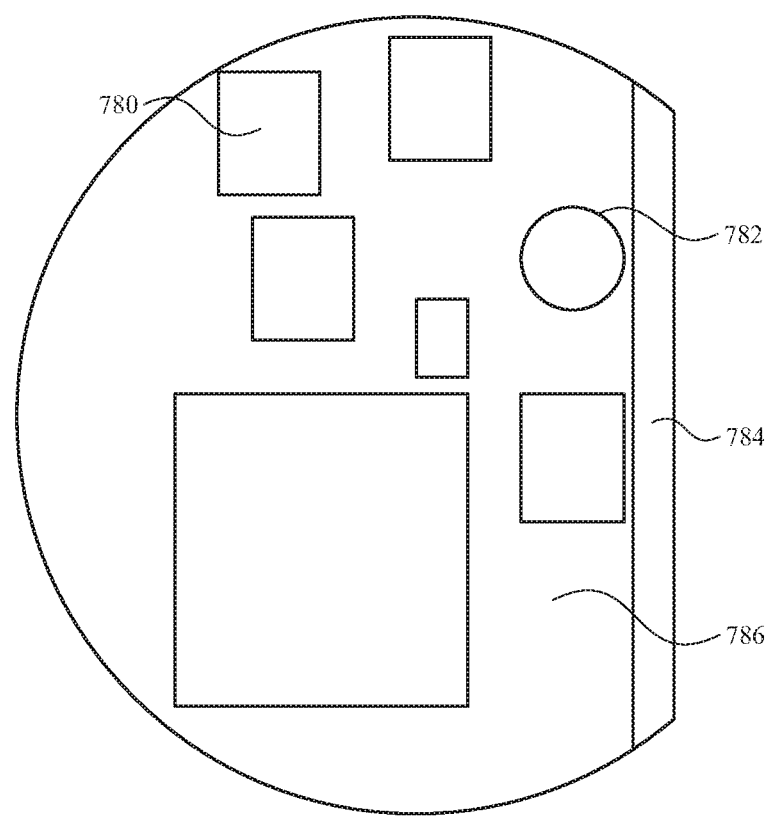
FIG. 15 illustrates a top view of a circuit board assembly with a plated surface.
Figure 16:
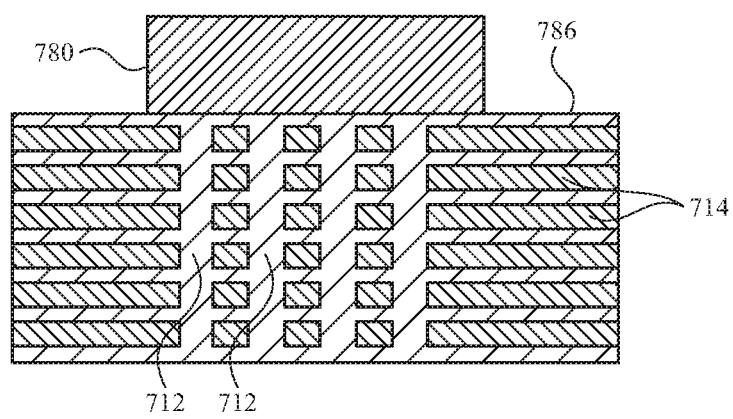
FIG. 16 illustrates a sectional view of the circuit board assembly of FIG. 15.

Thermal mitigation can be provided with arrangements of vias through layers of a circuit board. As shown in FIG. 15, a circuit board can include one or more circuit components 780 mounted to a substrate 784 having a conductive plate 786 on a surface thereof. The circuit board can include an opening 782 (e.g., boss) or other feature for mechanical coupling to other structures of the electronic device. The opening 782 can be configured to receive a fastener or other item to secure the circuit board. Heat can be thermally conducted along the conductive plate 786 and to the opening 782, as well as any fastener secured therein and adjacent portions of the electronic device. As shown in FIG. 16, vias 712 can extend from the circuit components 780 through a thickness of a substrate 784. The vias 712 can connect to the plate 786 as well as conductive layers 714 within the substrate 784. Where the plate 786 provides a continuous plane of conductive material and the vias 712 each provide straight thermal pathways, heat can be efficiently conducted from the circuit components 780 to other portions of the electronic device.

Figure 17:
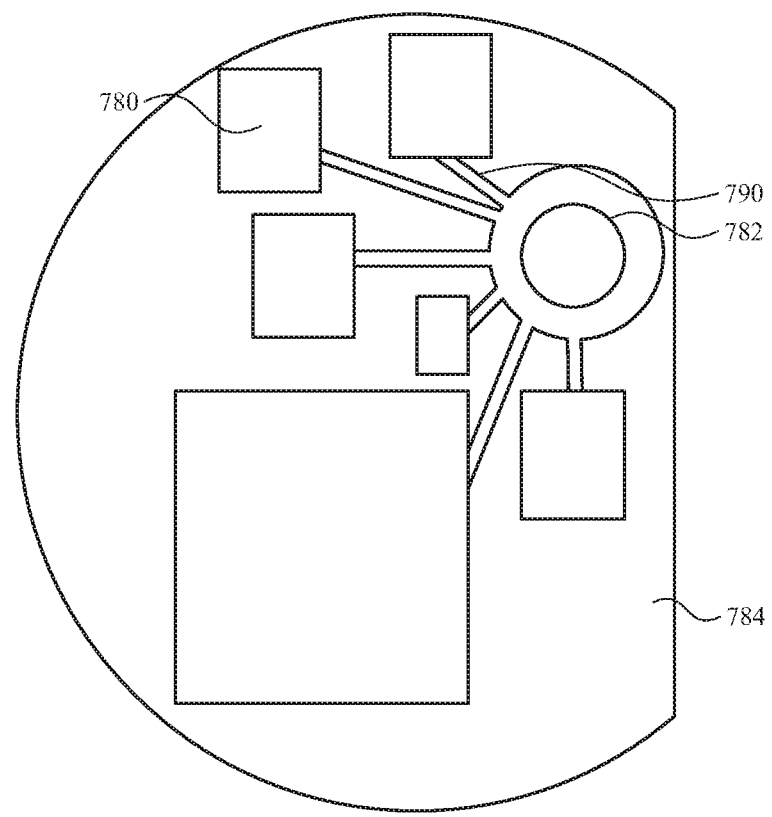
FIG. 17 illustrates a top view of a circuit board assembly with traces.
Figure 18:
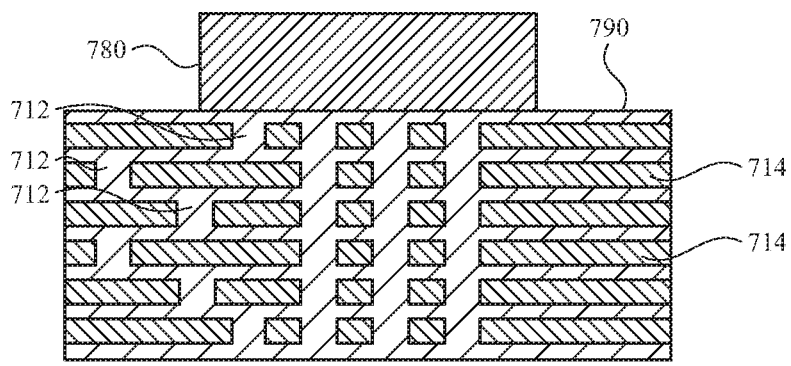
FIG. 18 illustrates a sectional view of the circuit board assembly of FIG. 17.

As shown in FIG. 17, a circuit board can also include one or more circuit components 780 mounted to a substrate 784 having one or more traces 790 printed on a surface thereof. Heat can be thermally conducted along the traces 790 and to the opening 782, as well as any fastener secured therein and adjacent portions of the electronic device. However, the thermal pathways are more limited than with the plate 786 of FIGS. 15 and 16. Accordingly thermal distribution would be less efficient. As shown in FIG. 18, vias 712 can extend from the circuit components 780 through a thickness of a substrate 784. The vias 712 can connect to the traces 790 as well as conductive layers 714 within the substrate 784. Rather than straight thermal pathways through the conductive layers 714, the vias 712 can have segments that are staggered, so that a thermal pathway is longer than a straight pathway across the thickness of the substrate 784. Accordingly, heat can be less efficiently conducted from the circuit components 780 to other portions of the electronic device.

A circuit board assembly 320 can include portions that incorporate the design of FIGS. 15 and 16, and other portions that incorporate the design of FIGS. 17 and 18. For example, between circuit components 780 and an opening 782 that is relatively far from an outer periphery of the electronic device, the more efficient thermal conductivity arrangements of FIGS. 15 and 16 can be provided. In the same circuit board assembly 320, between circuit components 780 and another opening 782 that is relatively close to an outer periphery of the electronic device, the less efficient thermal conductivity arrangements of FIGS. 17 and 18 can be provided. Accordingly, the thermal distribution can be controlled so that the thermal pathways more efficiently distribute heat across the entire board assembly before the heat emanates to the outer periphery of the device.

Figure 19:
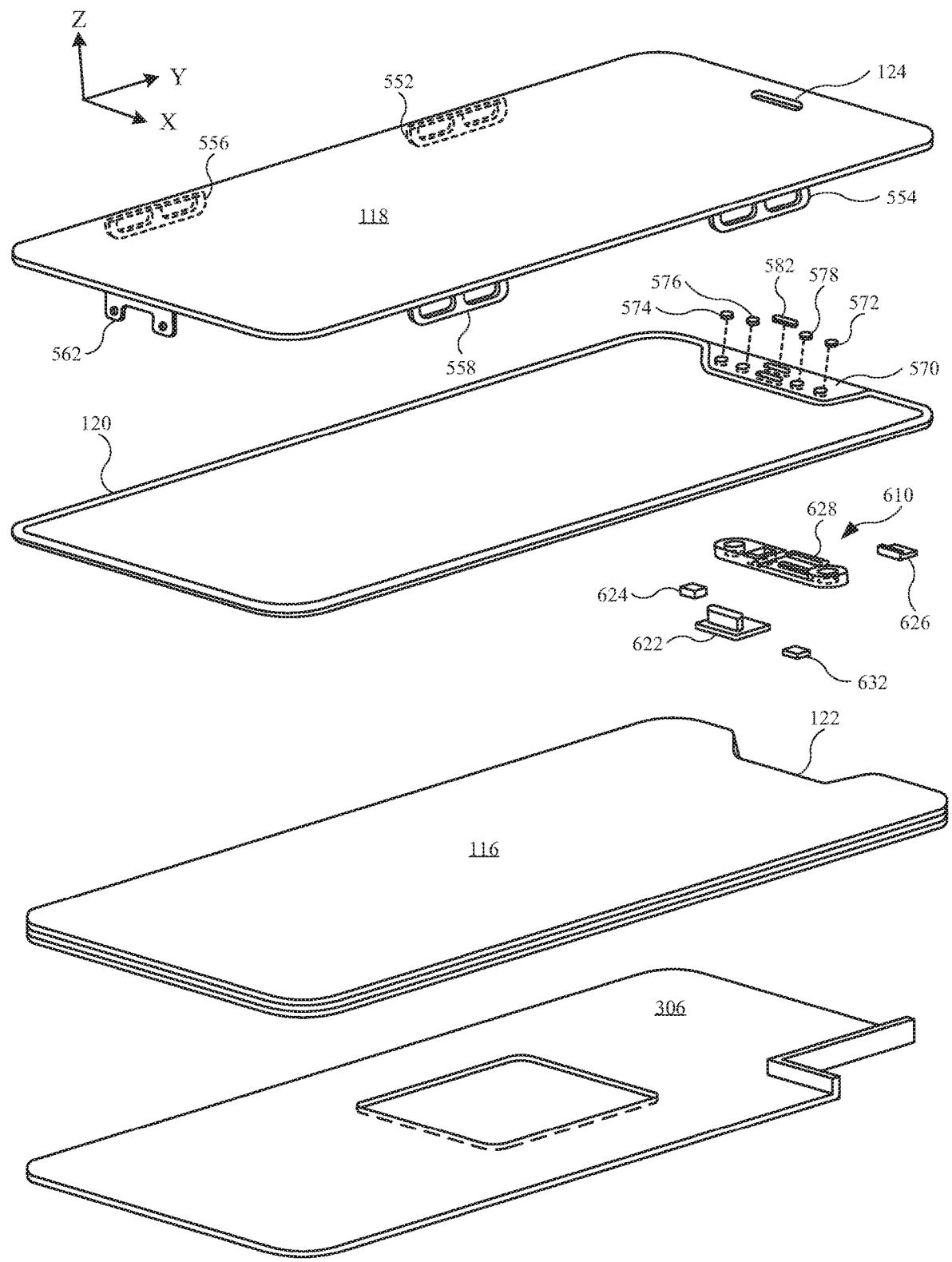
FIG. 19 illustrates an exploded view of the protective cover and the display assembly, as well as several additional components of the electronic device (shown in FIG. 1).

FIG. 19 illustrates an exploded view of the protective cover 118 and the display assembly 116, as well as several additional components of the electronic device 100 (shown in FIG. 1). As shown, the protective cover 118 may include several rails designed to secure the protective cover 118. For example, the protective cover 118 may include a first rail 552, a second rail 554, a third rail 556, and a fourth rail 558 designed to couple with the first rail clip 352, a second rail clip 354, a third rail clip 356, and a fourth rail clip 358, respectively, shown in FIG. 3. Also, the protective cover 118 may further include a fifth rail 562 designed to receive the first fastener 134 and the second fastener 136 (shown in FIG. 1).

The border 120 may secure with a surface (such as an internal surface) of the protective cover 118. In addition to the border 120 hiding or obscuring electrical and mechanical connections to the display assembly 116, additional layers may be used to hide or obscure some features. For example, an electronic device described herein may include a masking layer 570 designed to at least partially hide or obscure the vision system 410 and the bracket assembly 440. The masking layer 570 may include an opaque material designed to block light, including visible light, UV light, and IR light. The opaque material may include an ink material that is adhered to a surface of the protective cover 118. Also, the masking layer 570 may include an appearance, in terms of color and reflectivity, designed to match that of the border 120. For example, when the border 120 includes a black or white appearance (as non-limiting examples), the masking layer 570 may include a black or white appearance, respectively.

In order to allow the vision system 410 to provide object recognition, the masking layer 570 may include several openings (not labeled). However, at least some of the openings may be covered or filled by a material that is semi-opaque. For example, an electronic device described herein may include a layer 572 that covers an opening of the masking layer 570, a layer 574 that covers an additional opening of the masking layer 570, and a layer 576 that covers an additional opening of the masking layer 570. In some embodiments, the layer 572, the layer 574, and the layer 576 include an appearance, in terms of color and/or reflectivity, similar to that of the masking layer 570 (and accordingly, an appearance, in terms of color and/or reflectivity, similar to that of the border 120). However, the layer 572, the layer 574, and the layer 576 may be designed to filter out some light in some frequencies while selectively transmitting light in other frequencies. For example, the layer 572, the layer 574, and the layer 576 may block visible light (as well as other light), and allow IR light to permeate. As a result, the layer 572, the layer 574, and the layer 576 may be referred to as visible light filters. The layer 572, the layer 574, and the layer 576 may cover components of the vision system 410 designed to transmit/emit IR light or receive IR light. A light module 624 may also be aligned with a visible light filter.

Further, an electronic device described herein may include a layer 578 that covers an additional opening of the masking layer 570, and a layer 582 that covers an additional opening of the masking layer 570. In some embodiments, the layer 578 and the layer 582 include an appearance, in terms of color and/or reflectivity, similar to that of the masking layer 570 (and accordingly, an appearance, in terms of color and/or reflectivity, similar to that of the border 120). However, the layer 578 and the layer 582 may be designed to filter out some light in some frequencies while selectively transmitting light in other frequencies. For example, the layer 578 and the layer 582 may block IR light (as well as other light), and allow visible light to permeate. As a result, the layer 578 and the layer 582 may be referred to as IR light filters. The layer 578 and the layer 582 may cover components of the vision system 410 designed to receive visible light. An ambient light sensor 626 may also be aligned with an IR light filter.

In some instances, the bracket assembly 440 and the vision system 410 are not affixed in the electronic device 100 (shown in FIG. 1). Rather, the bracket assembly 440 (along with the vision system 410) may be placed in the internal volume 300 and are allowed to generally move freely with respect to, for example, the chassis 306 and the band 102. However, as the protective cover 118 is coupled with the band 102 (by way of the rails securing with the rail clips), the position of the bracket assembly 440 and the vision system 410 can be adjusted to a desired location in the internal volume 300, and compressive forces can retain the bracket assembly 440 and the vision system 410 in a desired location.

In this regard, an electronic device described herein may include an alignment module 610 that is coupled with the protective cover 118. In some instances, the masking layer 570, along with the light filter layers described above, is positioned between the protective cover 118 and the alignment module 610. The alignment module 610 may be coupled with the protective cover 118 in a location such when the protective cover 118 is assembled with the enclosure (or with the remaining portion of an electronic device), the alignment module 610 guides the modules of the vision system 410 such that the modules align with a desired light filter layer described above. This will be further shown and discussed below.

An electronic device described herein may further include an audio module 622 designed to generate acoustical energy. The audio module 622 may be seated on the alignment module 610 such that the audio module 622 is aligned with the opening 124 of the protective cover 118. An electronic device described herein may further include a light module 624 designed to generate light, such as IR light. The light module 624 may be used in conjunction with the vision system 410. For example, the light module 624 may provide additional IR light under conditions of relatively low light. The alignment module 610 may align the light module 624. An electronic device described herein may further include an ambient light sensor 626 designed to detect an amount of light external with respect to the electronic device. In some instances, the ambient light sensor 626 provides light conditions (such as low-light conditions) that can be used to activate the light module 624. The alignment module 610 may include a rail 628 used to align the ambient light sensor 626. Also, an electronic device described herein may further include a microphone 632 designed to receive acoustical energy. The microphone 632 may be at least partially aligned with the opening 124 of the protective cover 118.

The notch 122 (in the display assembly 116) is used to accommodate the alignment module 610, as well as the vision system 410. Also, the chassis 306 may be positioned below the display assembly 116 (in the Z-dimension). Accordingly, the chassis 306 may provide support to the display assembly 116 as well as other components.

Figure 20:
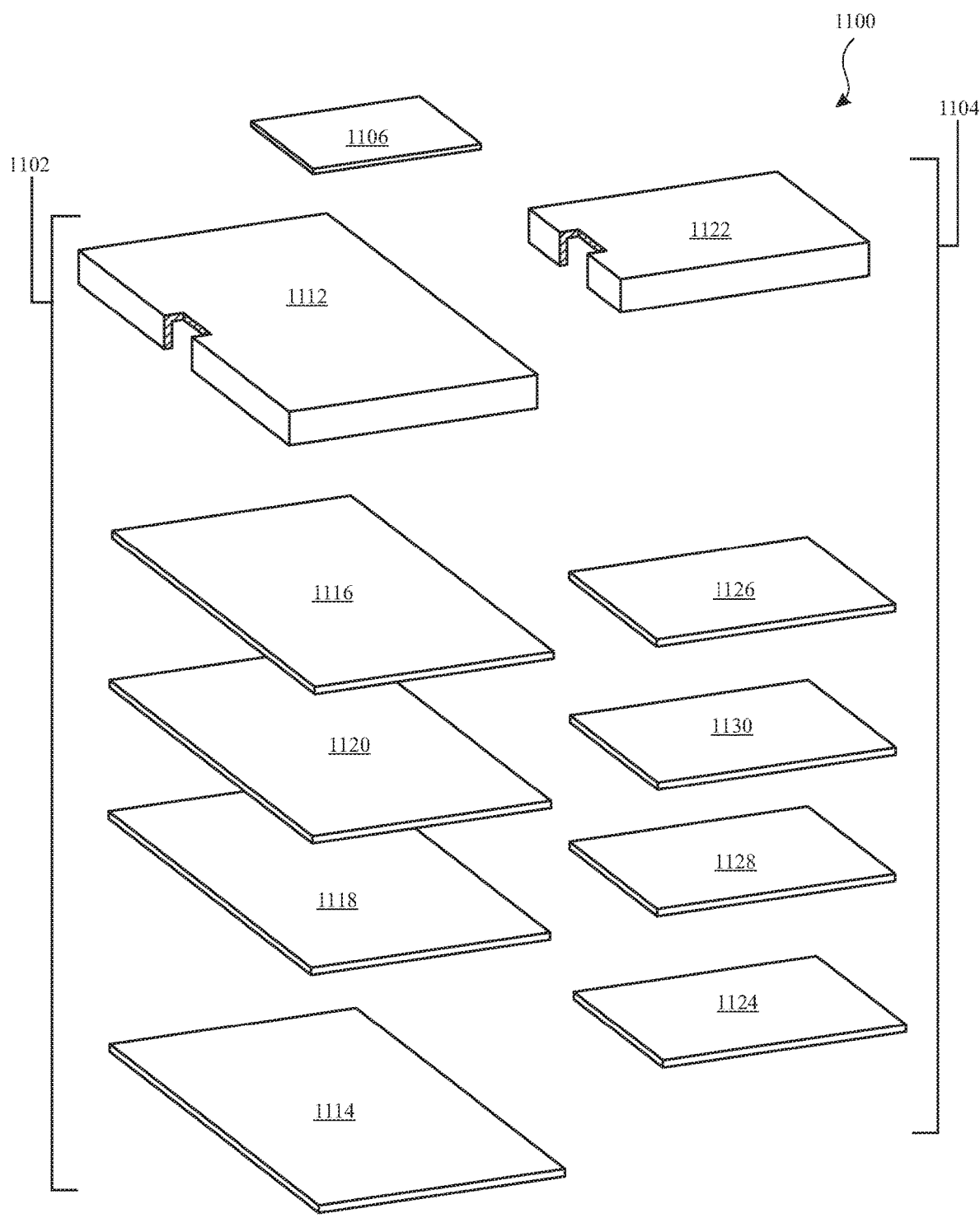
FIG. 20 illustrates an exploded view of a battery assembly.

FIG. 20 illustrates an exploded view of an embodiment of a battery assembly 1100, in accordance with some described embodiments. The battery assembly 1100 is designed for use as an internal power supply for electronic devices described herein. The battery assembly 1100 may include a rechargeable battery assembly that is charged and recharged by an external power supply using, for example, the port 126 (shown in FIG. 1) to receive power from cable and connector, or a wireless charging system.

As shown, the battery assembly 1100 may include first battery component 1102 and a second battery component 1104 coupled to the first battery component 1102 by a coupling member 1106. The coupling member 1106 may include an adhesive material.

The first battery component 1102 may include first housing component 1112 and a second housing component 1122, with the first housing component 1112 sealed with the second housing component 1122 forming a housing, or enclosure, that shields the internal components of the battery assembly 1100. The housing formed by the first housing component 1112 and the second housing component 1122 may define a cavity to receive and enclose internal components. For example, the battery assembly 1100 may further include a first electrode 1116 and a second electrode 1118 separate from the first electrode 1116 (such that each of the first electrode 1116 and the second electrode 1118 include a single piece electrode), with a separator 1120 that provides some physical isolation between the first electrode 1116 and the second electrode 1118, while still allowing the flow of electrical charge between the first electrode 1116 and the second electrode 1118. As commonly known in the art for a battery, one of the first electrode 1116 and the second electrode 1118 includes an anode, while the remaining electrode (of the first electrode 1116 and the second electrode 1118) includes a cathode. Also, as commonly known, electrodes can be used to convert chemical energy into electricity for use by an electronic device (such as the electronic device 100, shown in FIG. 1). Similarly, the second battery component 1104 may include electrodes 1126, 1128, and a separator 1120.

Figure 21:
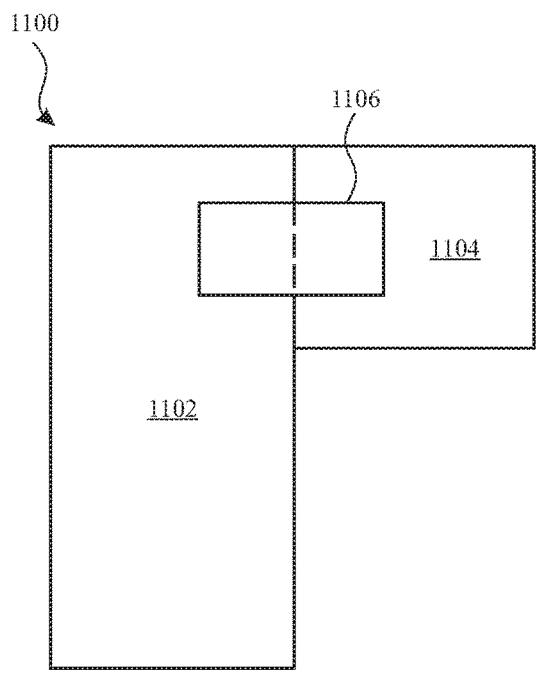
FIGS. 21-24 illustrate various configurations for a battery assembly utilizing multiple battery portions.

FIG. 21 illustrates a plan view of the battery assembly 1100 shown in FIG. 20, showing the first battery component 1102 coupled with the second battery component 1104 by the coupling member 1106. While traditional battery electrodes include a generally rectilinear shape, the electrodes in the battery assembly 1100, and battery assemblies described herein, may include different shapes. For example, the battery assembly 1100, when assembled, may resemble an "L-shaped configuration" in which the combination of the first battery component 1102 and the second battery component 1104 includes at least one surface of the battery assembly 1100 include six different sides. Although not shown, the battery assembly 1100 may further include a circuit board that includes one or more circuits designed to monitor electrical current flowing into and out of the battery assembly 1100. Also, the circuit board, as well as components of the circuit board, may be in electrical communication with the circuit board assembly.

As shown in FIG. 21, the system includes a battery assembly 1100 having a rectilinear shape that differs in at least two-dimensions (e.g., length and width). For example, as shown in the illustrated embodiment, the battery assembly 1100 has an L-shape having a first portion 1102 extending away from a second portion 1104. The shapes of the first and second portions 1102, 1104 allow the battery assembly 1100 to maximize volume within the device while still allowing space for adjacent components. For example, a circuit board (or any other suitable component) can be positioned adjacent the battery assembly 1100, and the first and second portions 1102, 1104 of the battery assembly can extend or wrap around the component(s) to fill the space. In other embodiments, the battery assembly 1100 can have other shapes and configurations, for example extending in different directions or filling other spaces two-dimensionally. In still further embodiments, the portions of the battery assembly 1100 can vary in shape in a third dimension (e.g., height).

In some embodiments, battery assembly 1100 is a single cell battery having the first and second portions 1102, 1104. In other embodiments, however, the first and second portions 1102, 1104 can be discrete or separate battery cells that are positioned adjacent to each other and electrically and functionally coupled to each other. For example, the first and second portions 1102, 1104 can individually be rectangular in shape, but the combination of the first and second portions 1102, 1104 adjacent to each other forms the two-dimensional battery system 1100 as shown in FIGS. 21-24. In further embodiments the battery assembly 1100 can include any number of discrete battery cells or portions that are positioned adjacent each other. In still further embodiments, discrete battery cells or portions can be spaced apart from each other.

Figure 22:
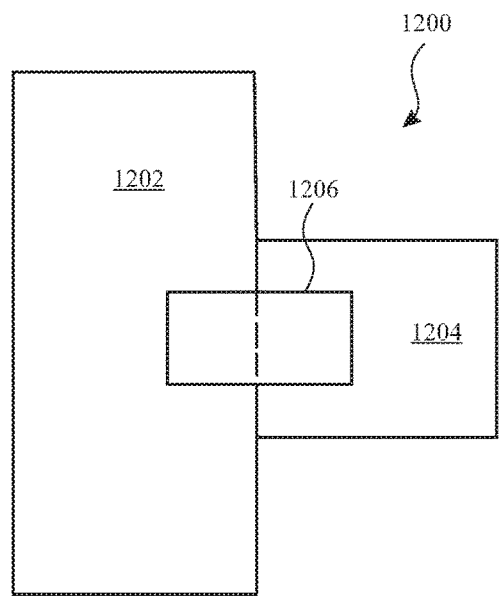
Figure 23:
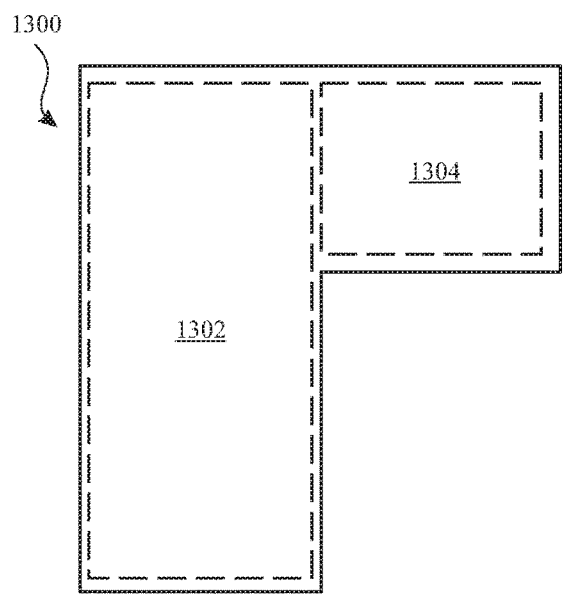
Figure 24:
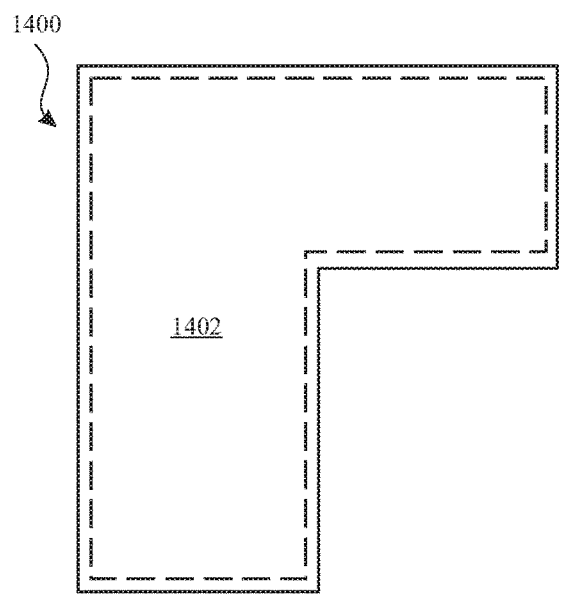

FIGS. 22-24 illustrate various embodiments of a battery assembly that may be incorporated into an electronic device described herein. FIG. 22 illustrates a plan view of an alternate embodiment of a battery assembly 1200, showing a first battery component 1202 coupled with a second battery component 1204 along a central location of the first battery component 1204, in accordance with some described embodiments. As shown, a coupling member 1206 can be used to secure the first battery component 1202 with the second battery component 1204. FIG. 22 exemplifies that the second battery component 1204 may be located in different positions relative to the first battery component 1202, making the battery assembly 1220 "flexible." In other words, the battery assembly 1200 may be reconfigured to form different shapes in order to accommodate other internal component of an electronic device, and avoid engineering design changes to the layout of the internal components of the electronic device.

FIG. 23 illustrates a plan view of an alternate embodiment of a battery assembly 1300, showing the battery assembly 1300 having a housing formed from a unitary body, in accordance with some described embodiments. As shown, the battery assembly 1300 may include a first battery component 1302 and a second battery component 1304, both of which are housed in the unitary housing of the battery assembly 1300. This may reduce the total number of parts, thereby reducing manufacturing time of the battery assembly 1300.

FIG. 24 illustrates a plan view of an alternate embodiment of a battery assembly 1400, showing the battery assembly 1400 having a housing formed from a unitary body and battery component 1402 positioned in the unitary housing, in accordance with some described embodiments. The battery component 1402 may take on a similar shape as that of the battery assembly 1400. Accordingly, the battery component 1402 may resemble an "L-shape".

Due to the component density inside the device, securely attaching a large battery assembly can be challenging. For example, other components can take up space that would otherwise be used for attaching the battery system within the device. For example, an inductive charging coil may reduce the surface area that is available to attach each of the first and second battery portions to a support or carrier. Accordingly, embodiments for attaching the battery system 1500 are shown in FIG. 25.

Figure 25:
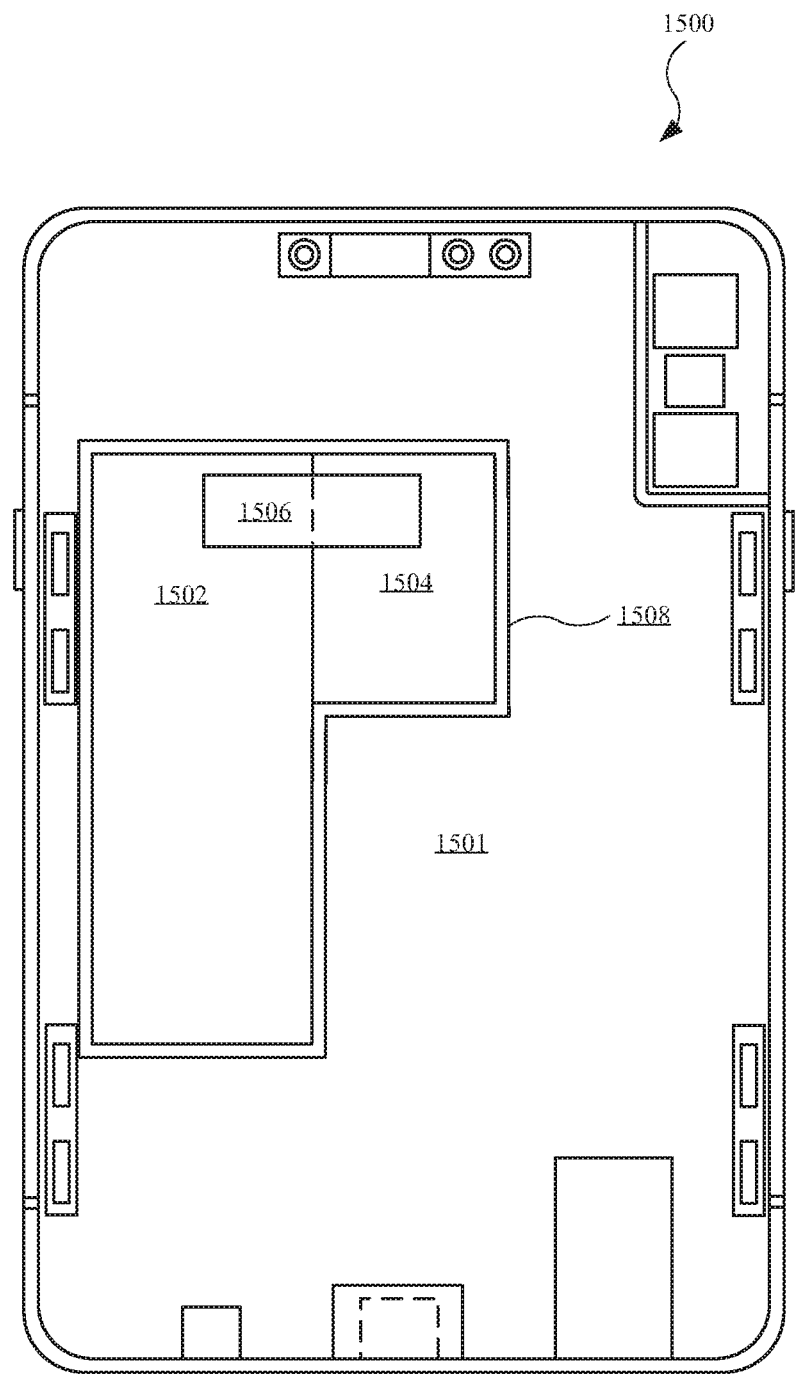
FIG. 25 illustrates an adhesive area and perimeter of an electronic device for a battery assembly.

As shown in FIG. 25, and for embodiments with adjacent but discrete battery portions, the battery system 1500 includes a first attachment area 1502 for attaching the first battery portion to a carrier 1501, and a second attachment area 1504 for attaching the second battery portion to the carrier 1501. The battery system 1500 also includes a third attachment area 1506 for attaching the first battery portion to the to the second battery portion. Accordingly, and as described in detail below, a first surface of each battery portion can independently be attached to the carrier 1501. A second surface of each battery portion can be attached together with an additional adhesive. Therefore, one side of each battery portion is independently attached to the carrier 1501, and an opposite side of the first battery portion is coupled directly to the first side of the second battery portion.

The first and second attachment areas 1502, 1504 can each include one or more pieces of adhesive to attach the first side of the corresponding battery portion to the carrier 1501. The adhesive can be any suitable adhesive for securing the battery system 1500 in the device. In some embodiments, for example, the adhesive can include multiple strips or segments of stretch release adhesive (e.g., adhesive that changes dimension in a first direction and therefore releases when the adhesive is pulled in s second direction (e.g., perpendicular direction) different the first direction. The attachment areas (1502 and 1504) may be surrounded by a perimeter frame or shim 1508, thus surrounding the attached battery cells. The perimeter frame may extend upward to a distance at or greater than the height of the battery cells so as to prevent other components from contacting the battery cells. In some embodiments, the first battery portion and the second battery portion are a single unit not requiring attachment between the two battery portions (e.g., no attachment at 1506). In such embodiments, the battery system 1500 may operate as a battery system with separate battery portions (e.g., separated battery cells). Furthermore, the battery system may be configured as a single battery cell that forms an L-shape, rather than attaching two battery cells together to attain the L-shape (e.g., a single battery cell is shaped and contained within the case of the battery).

Figure 26:
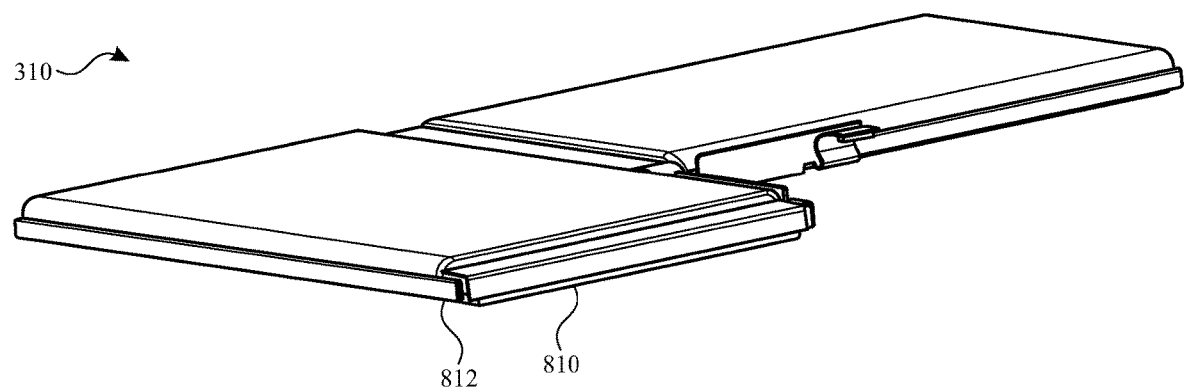
FIG. 26 illustrates a perspective view of a battery assembly.
Figure 27:
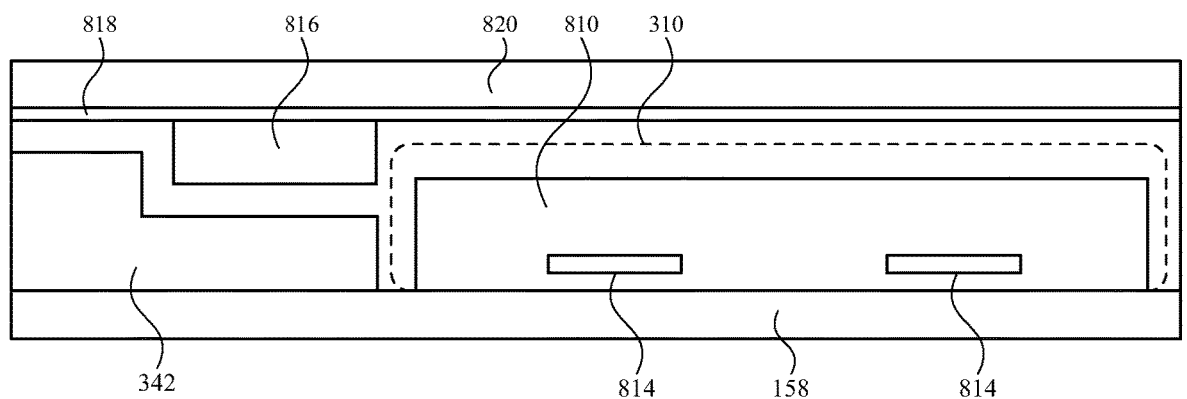
FIG. 27 illustrates a sectional view of an electronic device with the battery assembly of FIG. 26.

Referring now to FIGS. 26-29, components of the electronic device can be arranged to nest within each other when the device is assembled. As shown in FIG. 26, the battery assembly 310 can include a battery protection circuit module ("PCM") 810 (e.g., battery circuit component) that controls charge states of the battery. The battery PCM 810 can be located at a side or end of the battery pack seal 812 and have a generally elongated shape that conforms to an adjacent portion of the battery assembly 310. The battery PCM 810 and the battery assembly 310 can have similar dimensions in height, length, and/or width. As shown in FIG. 27, the display assembly can include a display flex 818 and a display circuit component 816 (e.g., integrated circuit) on an interior side of the display 820. When the electronic device is assembled, the display circuit component 816 can be located so that it nests within a space that is to one side of the battery assembly 310 and overlapping with another component, such as a speaker occupying a volume of space within the electronic device. The battery assembly 310 can include one or more tabs 814 for electrically, functionally, and operatively connecting the battery PCM 810 to the circuit board assembly of the electronic device. As shown in FIG. 27, the tabs 814 can be symmetrically positioned across a center region of the battery PCM 810.

Figure 28:
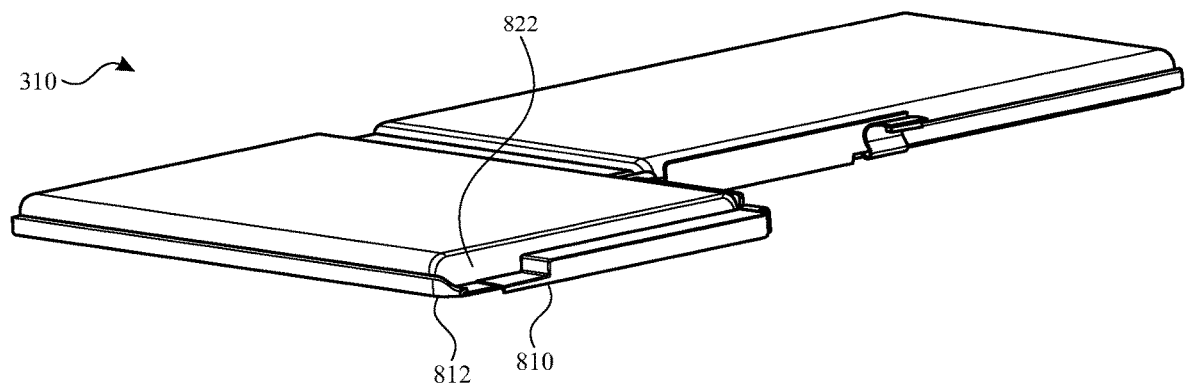
FIG. 28 illustrates a perspective view of a battery assembly.
Figure 29:
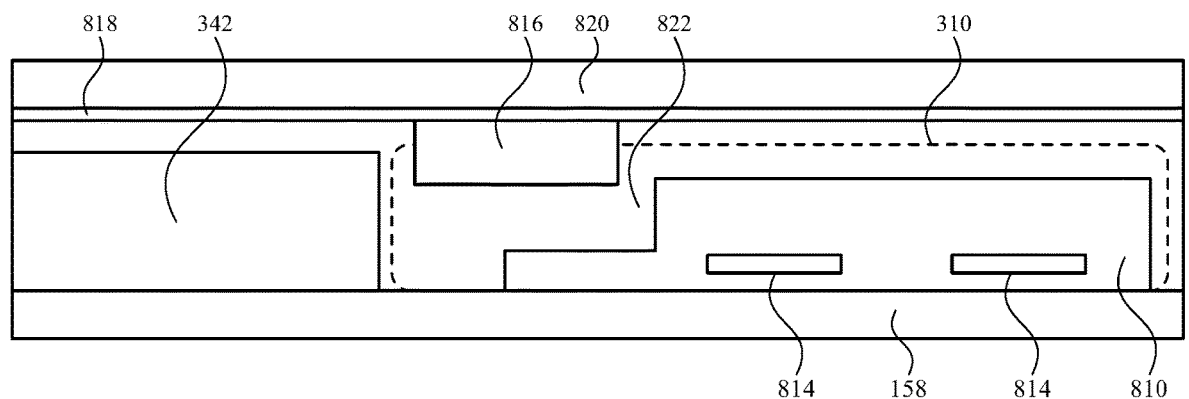
FIG. 29 illustrates a sectional view of an electronic device with the battery assembly of FIG. 28.

As shown in FIG. 28, the battery assembly 310 can include a battery PCM 810 similar to that described above, but that is reduced in size and provides a recess 822. At the recess 822, the battery PCM 810 can have a height that is less than a height of the battery assembly 310. As shown in FIG. 29, the display assembly can include a display flex 818 and a display integrated circuit ("IC") 816 on an interior side of the display 820. When the electronic device is assembled, the display circuit component 816 can be located so that it nests within the recess 822 of the battery PCM 810, and it therefore overlapping with a portion of the battery PCM 810 and displaced to a side of other components, such as an audio module 342 (e.g., speaker). The audio module 342 can therefore occupy a greater volume of space within the electronic device. Additionally or alternatively, the space can be occupied by other components. As shown in FIG. 29, the tabs 814 can also be shifted to be positioned to one side of the recess 822. As such, the tabs 814 can be asymmetrically distributed along the side of the battery PCM 810. The tabs 814 can be separated from each other and individually sealed to prevent ingress of substances.

Figure 30:
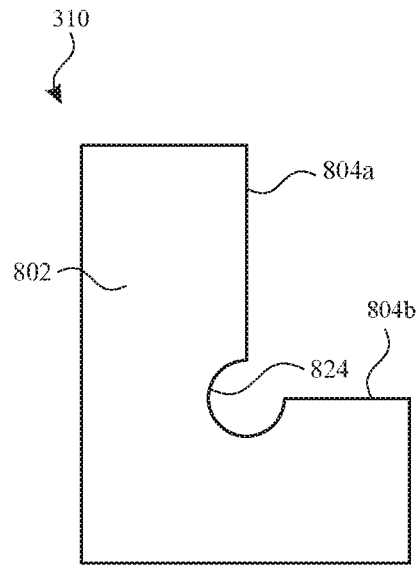
FIGS. 30-33 illustrate configurations for a battery assembly.

Referring now to FIGS. 30-33, a cell module of a battery can be contained within a pouch 830 in a manner that minimizes the thickness thereof to provide a compact battery assembly. As shown in FIG. 30, a cell module 802 of a battery assembly 310 can be provided in a generally L-shaped geometry. Edges 804a and 804b of the cell module 802 can intersect at or near an interior corner of the cell module 802. At the interior corner a cell notch 824 can be provided so that a space extends into the cell module 802 beyond the boundary defined by an extension of the edges 804a and 804b.

Figure 31:
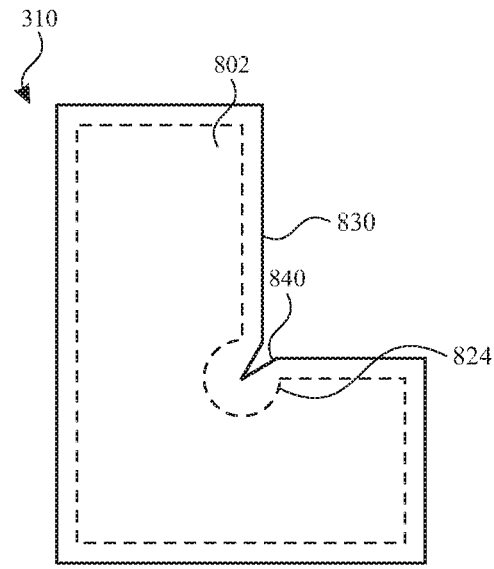

As shown in FIG. 31, a pouch 830 can be provided about the cell module 802. The pouch 830 can contain the anode and cathode components of the cell module 802 of the battery assembly 310. The pouch 830 can be sealed to isolate the cell module 802 from an external environment and to prevent ingress of substances to the cell module 802. The seal can be provided at or near the outer periphery of the pouch 830 and optionally beyond the edges of the cell module 802. At the outer periphery of the pouch 830, the edges thereof can define a pouch notch 840 that extends at least partially into the cell notch 824 of the cell module 802. The pouch notch 840 provides a space that minimizes material thickness of the pouch 830 in the vicinity of the cell notch 824.

Figure 32:
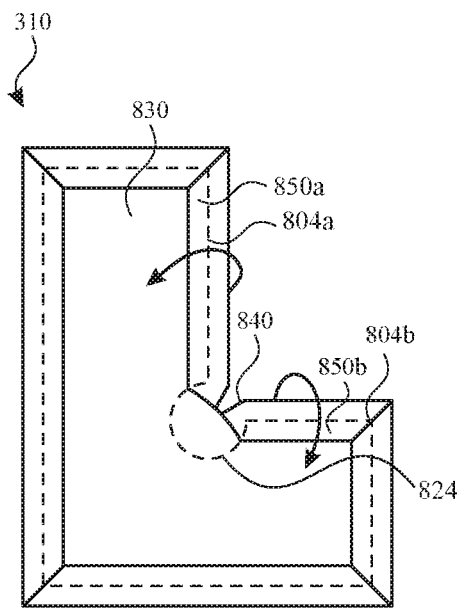

As shown in FIG. 32, tab portions at the outer periphery of the pouch 830 can be folded back over edges 804a and 804b of the cell module to overlap with interior portions of the pouch 830. The flaps 850a and 850b located adjacent to the pouch notch 840 of the pouch 830 and/or the cell notch 824 of the cell module can be folded in a manner that avoids or minimizes overlap of the flaps 850a and 850b. Additionally or alternatively, any excessive thickness in the region of the cell notch 824 can still be within or over a thickness of the cell module by residing within or over the cell notch 824. Accordingly, the pouch 830, including folded flaps 850a and 850b, can have a thin profile and compact assembly.

Figure 33:
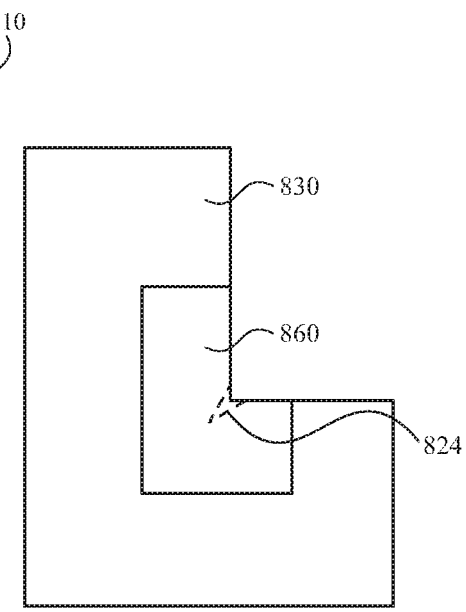

As shown in FIG. 33, one or more tape members 860 or other covering can be provided along portions of the pouch 830, including at the location or vicinity of the cell notch and/or pouch notch 840. The tape member 860 can provide a smooth surface along the outer sides and edges of the battery assembly 310. The tape member 860 can match the underlying pouch 830 in color and/or surface features to appear seamless with any exposed portions of the underlying pouch 830.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and magnets are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A circuit board assembly for an electronic device, the circuit board assembly comprising:
    a circuit component;
    a first stiffener extending along a first surface of the circuit component;
    a cover extending along a surface of the first stiffener; and
    a second stiffener extending along a second surface of the circuit component, adjacent to the first surface, the second stiffener comprising an inner layer comprising a first metal and outer layers comprising a second metal.

2. The circuit board assembly of claim 1, wherein the outer layers have a higher rigidity than a rigidity of the first metal.

3. The circuit board assembly of claim 1, wherein the first metal has a higher thermal conductivity than the second metal.

4. The circuit board assembly of claim 1, wherein the second stiffener has a higher rigidity than a rigidity of the first stiffener and cover.

5. The circuit board assembly of claim 1, wherein the second stiffener is positioned on a portion of the circuit component that is not covered by the first stiffener and the cover.

6. The circuit board assembly of claim 1, wherein the first stiffener comprises the second metal.

7. The circuit board assembly of claim 1, wherein the second stiffener is adjacent to the first stiffener and the cover.

8. A circuit board assembly for an electronic device, the circuit board assembly comprising:
    a substrate;
    a circuit component on the substrate;
    a trace connected to the circuit component and extending along a surface of the substrate; and
    multiple vias extending from the trace and forming a non-linear pathway through the substrate.

9. The circuit board assembly of claim 8, wherein the trace extends about an opening extending through the substrate, the opening being configured to receive a fastener to secure the circuit board assembly to a housing.

10. The circuit board assembly of claim 8, wherein each of the vias comprises segments each at a different depth away from the trace, each of the segments extending along a different axis that intersects a different portion of the trace.

11. The circuit board assembly of claim 8, wherein each of the vias extends through multiple conductive layers beneath the surface of the substrate.

12. The circuit board assembly of claim 8, wherein at least some of the vias extend outside a region of the substrate that is beneath the circuit component.

13. An electronic device comprising:
a battery assembly comprising a battery circuit component having a first portion with a first thickness and a second portion with a second thickness less than the first thickness and defining a recess; and
a display assembly comprising a display circuit component protruding into the recess defined by the battery circuit component.

14. The battery assembly of claim 13, wherein the display assembly comprises a display surface that extends over an entirety of the battery assembly.

15. The battery assembly of claim 13, wherein the display circuit component is nested within a region partially surrounded by the battery circuit component.

16. The battery assembly of claim 13, wherein the display circuit component is a battery protection circuit module.

17. A battery assembly comprising:
a cell module comprising a first edge and a second edge that are connected by a cell notch in the cell module; and
a pouch comprising a first flap folded over the first edge toward the cell module and a second flap folded over the second edge toward the cell module, the first flap and the second flap being connected to each other over the cell notch of the cell module.

18. The battery assembly of claim 17, wherein the cell notch is formed at an interior corner of the cell module.

19. The battery assembly of claim 17, wherein the first flap and the second flap are connected by a pouch notch that is formed over the cell notch in the cell module.

20. The battery assembly of claim 17, further comprising a tape member covering at least a portion of the first flap, the second flap, and the cell notch.

\* \* \* \* \*